(12) United States Patent
Zeine et al.

(10) Patent No.: US 9,997,963 B2
(45) Date of Patent: Jun. 12, 2018

(54) TECHNIQUES FOR SCHEDULING DELIVERY OF WIRELESS POWER IN WIRELESS POWER DELIVERY ENVIRONMENTS

(71) Applicant: Ossia Inc., Bellevue, WA (US)

(72) Inventors: Hatem Zeine, Bellevue, WA (US); Dale Mayes, Bothell, WA (US); Fady El-Rukby, Redmond, WA (US); Douglas Williams, Bellevue, WA (US); Prithvi Shylendra, Seattle, WA (US)

(73) Assignee: Ossia Inc., Bellevue, WA (US)

( * ) Notice: Subject to any disclaimer, the term of this patent is extended or adjusted under 35 U.S.C. 154(b) by 46 days.

(21) Appl. No.: 15/175,773

(22) Filed: Jun. 7, 2016

(65) Prior Publication Data
US 2016/0359376 A1   Dec. 8, 2016

Related U.S. Application Data

(60) Provisional application No. 62/172,752, filed on Jun. 8, 2015.

(51) Int. Cl.
*H01F 38/00* (2006.01)
*H02J 50/80* (2016.01)
(Continued)

(52) U.S. Cl.
CPC ...... *H02J 50/80* (2016.02); *G01R 31/318566* (2013.01); *G01R 31/40* (2013.01);
(Continued)

(58) Field of Classification Search
CPC .. H02J 50/80; H02J 50/20; H02J 7/025; H02J 7/045
(Continued)

(56) References Cited

U.S. PATENT DOCUMENTS

| 7,889,777 B2 | 2/2011 | Ruijter et al. |
| 2010/0033021 A1* | 2/2010 | Bennett ............. H02J 17/00 307/104 |

(Continued)

FOREIGN PATENT DOCUMENTS

| WO | 2010118075 A2 | 10/2010 |
| WO | 2014106390 A1 | 7/2014 |

OTHER PUBLICATIONS

Notification of Transmittal of the International Search Report and the Written Opinion of the International Searching Authority, or the Declaration received in International Application No. PCT/US2016/36411 dated Sep. 2, 2016, 14 pages.
(Continued)

*Primary Examiner* — Alfonso Perez Borroto

(57) ABSTRACT

Techniques are described herein for utilizing power requirements of a device in order to schedule wireless power delivery in wireless power delivery environments. In some embodiments, the techniques can alternatively or additionally employ advanced usage based power models to schedule wireless power delivery in wireless power delivery environments. For embodiments where device usage information is utilized, various means of collecting and analyzing the usage data may be employed. Furthermore, in some embodiments, some of the usage data may be ignored in order to ensure that the usage models for the device are not polluted with abnormal or detrimental data.

17 Claims, 21 Drawing Sheets

(51) Int. Cl.
  *H02J 7/02*      (2016.01)
  *H02J 50/20*     (2016.01)
  *H02J 50/40*     (2016.01)
  *G01R 31/3185*   (2006.01)
  *G01R 31/40*     (2014.01)
  *H04W 4/12*      (2009.01)
  *H02J 7/04*      (2006.01)
  *H04L 12/64*     (2006.01)
  *H04W 52/02*     (2009.01)
  *H04L 12/28*     (2006.01)
  *H04L 29/08*     (2006.01)
  *H04W 8/00*      (2009.01)

(52) U.S. Cl.
  CPC ............ *H02J 7/025* (2013.01); *H02J 7/045* (2013.01); *H02J 50/20* (2016.02); *H02J 50/40* (2016.02); *H04L 12/6418* (2013.01); *H04W 4/12* (2013.01); *H04L 12/2818* (2013.01); *H04L 67/12* (2013.01); *H04L 2012/2841* (2013.01); *H04W 8/005* (2013.01); *H04W 52/0212* (2013.01)

(58) Field of Classification Search
  USPC ........................................................ 307/104
  See application file for complete search history.

(56) References Cited

U.S. PATENT DOCUMENTS

| | | |
|---|---|---|
| 2010/0201202 A1 | 8/2010 | Kirby et al. |
| 2010/0201533 A1 | 8/2010 | Kirby et al. |
| 2011/0270452 A1* | 11/2011 | Lu ................. G05B 19/042 700/291 |
| 2012/0206096 A1 | 8/2012 | John |
| 2013/0154557 A1 | 6/2013 | Lee et al. |
| 2013/0278209 A1* | 10/2013 | Von Novak, III ...... H02J 7/025 320/108 |
| 2014/0008992 A1 | 1/2014 | Leabman |
| 2014/0285145 A1* | 9/2014 | Patro .................. H02J 7/025 320/108 |
| 2014/0375261 A1 | 12/2014 | Manova-Elssibony et al. |

OTHER PUBLICATIONS

Notification of Transmittal of the International Search Report and the Written Opinion of the International Searching Authority, or the Declaration received in International Application No. PCT/US2016/036493 dated Sep. 13, 2016, 24 pages.

Notification of Transmittal of the International Search Report and the Written Opinion of the International Searching Authority, or the Declaration received in International Application No. PCT/US2016/036404 dated Sep. 15, 2016, 13 pages.

* cited by examiner

TECHNIQUES FOR SCHEDULING DELIVERY OF WIRELESS POWER IN WIRELESS POWER DELIVERY ENVIRONMENTS

CROSS-REFERENCE TO RELATED APPLICATIONS

This application claims priority to and benefit from U.S. Provisional Patent Application Ser. No. 62/172,752 titled "SYSTEMS AND METHODS FOR IMPROVED WIRELESS POWER TRANSFERS" filed on Jun. 8, 2015, which is expressly incorporated by reference herein.

TECHNICAL FIELD

The technology described herein relates generally to the field of wireless power transmission and, more specifically, to techniques for scheduling delivery of wireless power in wireless power delivery environments.

BACKGROUND

Many electronic devices are powered by batteries. Rechargeable batteries are often used to avoid the cost of replacing conventional dry-cell batteries and to conserve precious resources. However, recharging batteries with conventional rechargeable battery chargers requires access to an alternating current (AC) power outlet, which is sometimes not available or not convenient. It would, therefore, be desirable to derive power for electronics wirelessly.

Accordingly, a need exists for technology that overcomes the problem demonstrated above, as well as one that provides additional benefits. The examples provided herein of some prior or related systems and their associated limitations are intended to be illustrative and not exclusive. Other limitations of existing or prior systems will become apparent to those of skill in the art upon reading the following Detailed Description.

BRIEF DESCRIPTION OF THE DRAWINGS

One or more embodiments of the present invention are illustrated by way of example and not limitation in the figures of the accompanying drawings, in which like references indicate similar elements.

DETAILED DESCRIPTION

Figure 1:
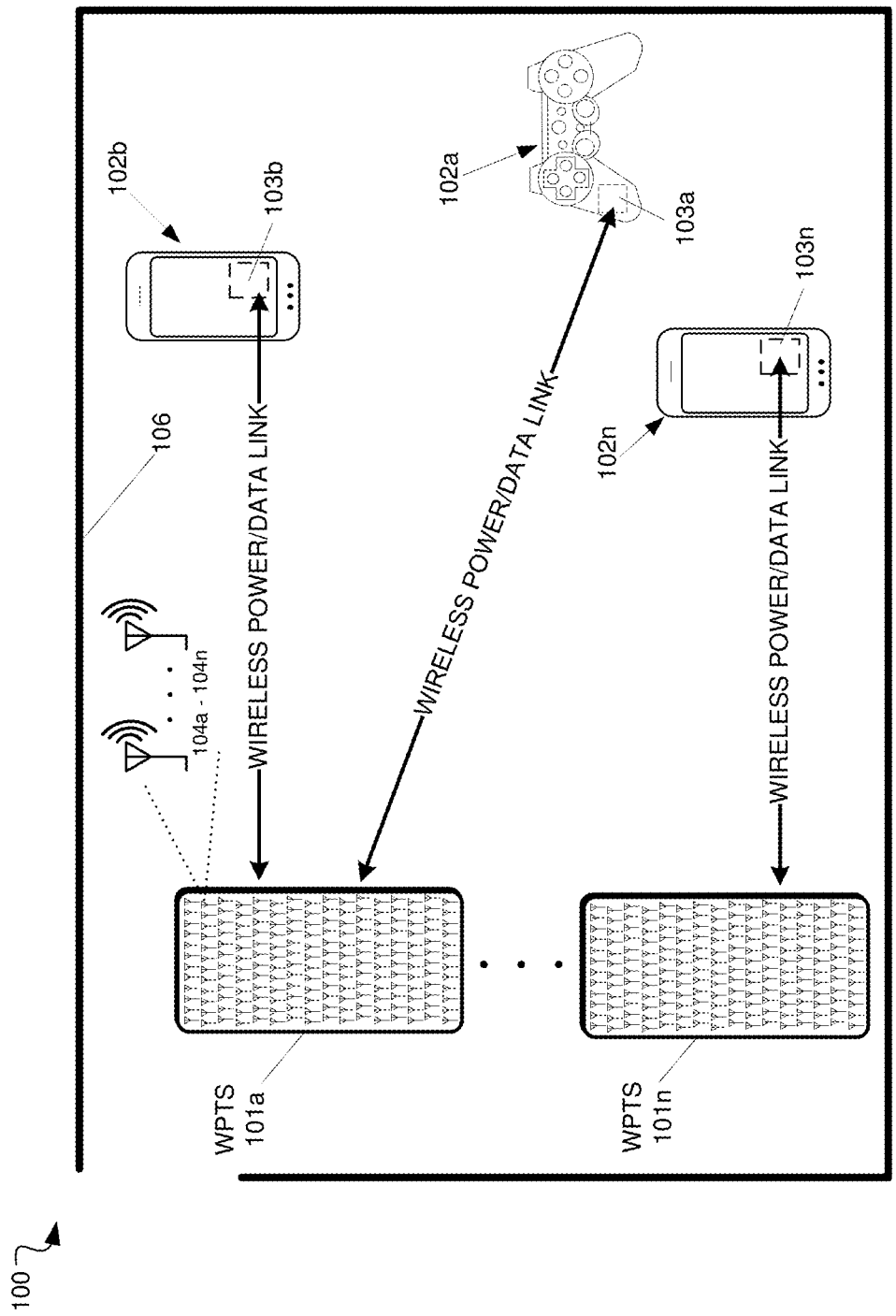
FIG. 1 depicts a block diagram including an example wireless power delivery environment illustrating wireless power delivery from one or more wireless power transmission systems to various wireless devices within the wireless power delivery environment in accordance with some embodiments.

The following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be, but not necessarily are, references to the same embodiment; and, such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but no other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

I. Wireless Power Transmission System Overview/Architecture

FIG. 1 depicts a block diagram including an example wireless power delivery environment 100 illustrating wireless power delivery from one or more wireless power transmission systems (WPTS) 101a-n (also referred to as "wireless power delivery systems", "antenna array systems" and "wireless chargers") to various wireless devices 102a-n within the wireless power delivery environment 100, according to some embodiments. More specifically, FIG. 1 illustrates an example wireless power delivery environment 100 in which wireless power and/or data can be delivered to available wireless devices 102a-102n having one or more wireless power receiver clients 103a-103n (also referred to herein as "clients" and "wireless power receivers"). The wireless power receiver clients are configured to receive and process wireless power from one or more wireless power transmission systems 101a-101n. Components of an example wireless power receiver client 103 are shown and discussed in greater detail with reference to FIG. 4.

As shown in the example of FIG. 1, the wireless devices 102a-102n include mobile phone devices and a wireless game controller. However, the wireless devices 102a-102n can be any device or system that needs power and is capable of receiving wireless power via one or more integrated power receiver clients 103a-103n. As discussed herein, the one or more integrated power receiver clients receive and process power from one or more wireless power transmission systems 101a-101n and provide the power to the wireless devices 102a-102n (or internal batteries of the wireless devices) for operation thereof.

Each wireless power transmission system 101 can include multiple antennas 104a-n, e.g., an antenna array including hundreds or thousands of antennas, which are capable of delivering wireless power to wireless devices 102. In some embodiments, the antennas are adaptively-phased radio frequency (RF) antennas. The wireless power transmission system 101 is capable of determining the appropriate phases with which to deliver a coherent power transmission signal to the power receiver clients 103. The array is configured to emit a signal (e.g., continuous wave or pulsed power transmission signal) from multiple antennas at a specific phase relative to each other. It is appreciated that use of the term "array" does not necessarily limit the antenna array to any specific array structure. That is, the antenna array does not need to be structured in a specific "array" form or geometry. Furthermore, as used herein the term "array" or "array system" may be used include related and peripheral circuitry for signal generation, reception and transmission, such as radios, digital logic and modems. In some embodiments, the wireless power transmission system 101 can have an embedded Wi-Fi hub for data communications via one or more antennas or transceivers.

The wireless devices 102 can include one or more receive power clients 103. As illustrated in the example of FIG. 1, power delivery antennas 104a-104n are shown. The power delivery antennas 104a are configured to provide delivery of wireless radio frequency power in the wireless power delivery environment. In some embodiments, one or more of the power delivery antennas 104a-104n can alternatively or additionally be configured for data communications in addition to or in lieu of wireless power delivery. The one or more data communication antennas are configured to send data communications to and receive data communications from the power receiver clients 103a-103n and/or the wireless devices 102a-102n. In some embodiments, the data communication antennas can communicate via Bluetooth™, Wi-Fi™, ZigBee™, etc. Other data communication protocols are also possible.

Each power receiver client 103a-103n includes one or more antennas (not shown) for receiving signals from the wireless power transmission systems 101a-101n. Likewise, each wireless power transmission system 101a-101n includes an antenna array having one or more antennas and/or sets of antennas capable of emitting continuous wave or discrete (pulse) signals at specific phases relative to each other. As discussed above, each the wireless power transmission systems 101a-101n is capable of determining the appropriate phases for delivering the coherent signals to the power receiver clients 102a-102n. For example, in some embodiments, coherent signals can be determined by computing the complex conjugate of a received beacon (or calibration) signal at each antenna of the array such that the coherent signal is phased for delivering power to the particular power receiver client that transmitted the beacon (or calibration) signal.

Although not illustrated, each component of the environment, e.g., wireless device, wireless power transmission system, etc., can include control and synchronization mechanisms, e.g., a data communication synchronization module. The wireless power transmission systems 101a-

101n can be connected to a power source such as, for example, a power outlet or source connecting the wireless power transmission systems to a standard or primary alternating current (AC) power supply in a building. Alternatively, or additionally, one or more of the wireless power transmission systems 101a-101n can be powered by a battery or via other mechanisms, e.g., solar cells, etc.

The power receiver clients 102a-102n and/or the wireless power transmission systems 101a-101n are configured to operate in a multipath wireless power delivery environment. That is, the power receiver clients 102a-102n and the wireless power transmission systems 101a-101n are configured to utilize reflective objects 106 such as, for example, walls or other RF reflective obstructions within range to transmit beacon (or calibration) signals and/or receive wireless power and/or data within the wireless power delivery environment. The reflective objects 106 can be utilized for multi-directional signal communication regardless of whether a blocking object is in the line of sight between the wireless power transmission system and the power receiver client.

As described herein, each wireless device 102a-102n can be any system and/or device, and/or any combination of devices/systems that can establish a connection with another device, a server and/or other systems within the example environment 100. In some embodiments, the wireless devices 102a-102n include displays or other output functionalities to present data to a user and/or input functionalities to receive data from the user. By way of example, a wireless device 102 can be, but is not limited to, a video game controller, a server desktop, a desktop computer, a computer cluster, a mobile computing device such as a notebook, a laptop computer, a handheld computer, a mobile phone, a smart phone, a PDA, a Blackberry device, a Treo, and/or an iPhone, etc. By way of example and not limitation, the wireless device 102 can also be any wearable device such as watches, necklaces, rings or even devices embedded on or within the customer. Other examples of a wireless device 102 include, but are not limited to, safety sensors (e.g., fire or carbon monoxide), electric toothbrushes, electronic door lock/handles, electric light switch controller, electric shavers, etc.

Although not illustrated in the example of FIG. 1, the wireless power transmission system 101 and the power receiver clients 103a-103n can each include a data communication module for communication via a data channel. Alternatively, or additionally, the power receiver clients 103a-103n can direct the wireless devices 102.1-102.n to communicate with the wireless power transmission system via existing data communications modules. In some embodiments the beacon signal, which is primarily referred to herein as a continuous waveform, can alternatively or additionally take the form of a modulated signal.

Figure 2:
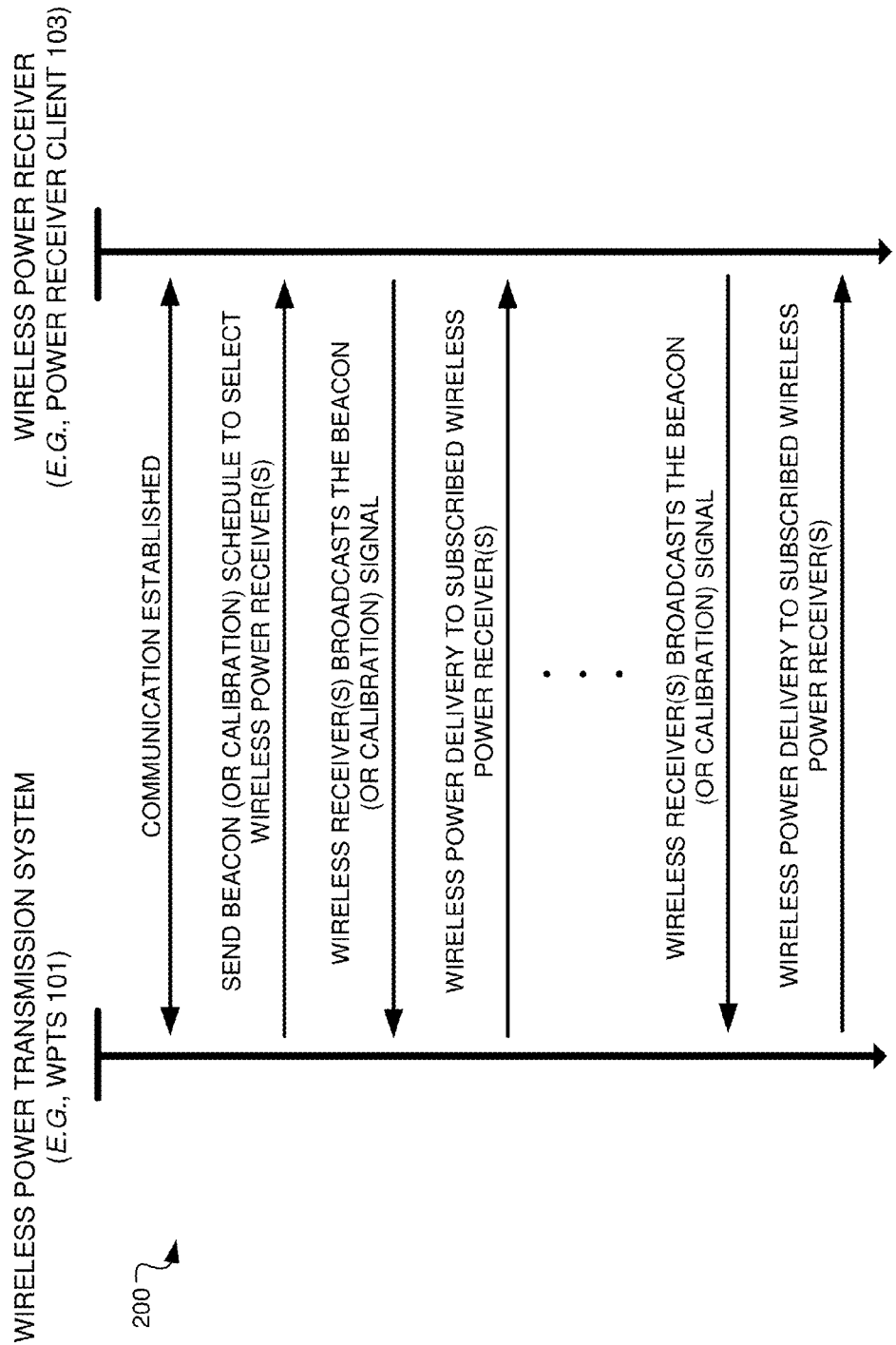
FIG. 2 depicts a sequence diagram illustrating example operations between a wireless power transmission system and a wireless receiver client for commencing wireless power delivery in accordance with some embodiments.

FIG. 2 is a sequence diagram 200 illustrating example operations between a wireless power delivery system (e.g., WPTS 101) and a wireless power receiver client (e.g., wireless power receiver client 103) for establishing wireless power delivery in a multipath wireless power delivery, according to an embodiment. Initially, communication is established between the wireless power transmission system 101 and the power receiver client 103. The initial communication can be, for example, a data communication link that is established via one or more antennas 104 of the wireless power transmission system 101. As discussed, in some embodiments, one or more of the antennas 104a-104n can be data antennas, wireless power transmission antennas, or dual-purpose data/power antennas. Various information can be exchanged between the wireless power transmission system 101 and the wireless power receiver client 103 over this data communication channel. For example, wireless power signaling can be time sliced among various clients in a wireless power delivery environment. In such cases, the wireless power transmission system 101 can send beacon schedule information, e.g., Beacon Beat Schedule (BBS) cycle, power cycle information, etc., so that the wireless power receiver client 103 knows when to transmit (broadcast) its beacon signals and when to listen for power, etc.

Continuing with the example of FIG. 2, the wireless power transmission system 101 selects one or more wireless power receiver clients for receiving power and sends the beacon schedule information to the select power receiver clients 103. The wireless power transmission system 101 can also send power transmission scheduling information so that the power receiver client 103 knows when to expect (e.g., a window of time) wireless power from the wireless power transmission system. The power receiver client 103 then generates a beacon (or calibration) signal and broadcasts the beacon during an assigned beacon transmission window (or time slice) indicated by the beacon schedule information, e.g., Beacon Beat Schedule (BBS) cycle. As discussed herein, the wireless power receiver client 103 include one or more antennas (or transceivers) which have a radiation and reception pattern in three-dimensional space proximate to the wireless device 102 in which the power receiver client 103 is embedded.

The wireless power transmission system 101 receives the beacon from the power receiver client 103 and detects and/or otherwise measures the phase (or direction) from which the beacon signal is received at multiple antennas. The wireless power transmission system 101 then delivers wireless power to the power receiver client 103 from the multiple antennas 103 based on the detected or measured phase (or direction) of the received beacon at each of the corresponding antennas. In some embodiments, the wireless power transmission system 101 determines the complex conjugate of the measured phase of the beacon and uses the complex conjugate to determine a transmit phase that configures the antennas for delivering and/or otherwise directing wireless power to the power receiver client 103 via the same path over which the beacon signal was received from the power receiver client 103.

In some embodiments, the wireless power transmission system 101 includes many antennas; one or more of which are used to deliver power to the power receiver client 103. The wireless power transmission system 101 can detect and/or otherwise determine or measure phases at which the beacon signals are received at each antenna. The large number of antennas may result in different phases of the beacon signal being received at each antenna of the wireless power transmission system 101. As discussed above, the wireless power transmission system 101 can determine the complex conjugate of the beacon signals received at each antenna. Using the complex conjugates, one or more antennas may emit a signal that takes into account the effects of the large number of antennas in the wireless power transmission system 101. In other words, the wireless power transmission system 101 can emit a wireless power transmission signal from the one or more antennas in such a way as to create an aggregate signal from the one or more of the antennas that approximately recreates the waveform of the beacon in the opposite direction. Said another way, the wireless power transmission system 101 can deliver wireless RF power to the client device via the same paths over which the beacon signal is received at the wireless power transmission system 101. These paths can utilize reflective objects 106 within the environment. Additionally, the wireless power transmission signals can be simultaneously transmitted from the wireless power transmission system 101 such that the wireless power transmission signals collectively match the antenna radiation and reception pattern of the client device in a three-dimensional (3D) space proximate to the client device.

As shown, the beacon (or calibration) signals can be periodically transmitted by power receiver clients 103 within the power delivery environment according to, for example, the BBS, so that the wireless power transmission system 101 can maintain knowledge and/or otherwise track the location of the power receiver clients 103 in the wireless power delivery environment. The process of receiving beacon signals from a wireless power receiver client at the wireless power transmission system and, in turn, responding with wireless power directed to that particular client is referred to herein as retrodirective wireless power delivery.

Furthermore, as discussed herein, wireless power can be delivered in power cycles defined by power schedule information. A more detailed example of the signaling required to commence wireless power delivery is described now with reference to FIG. 3.

Figure 3:
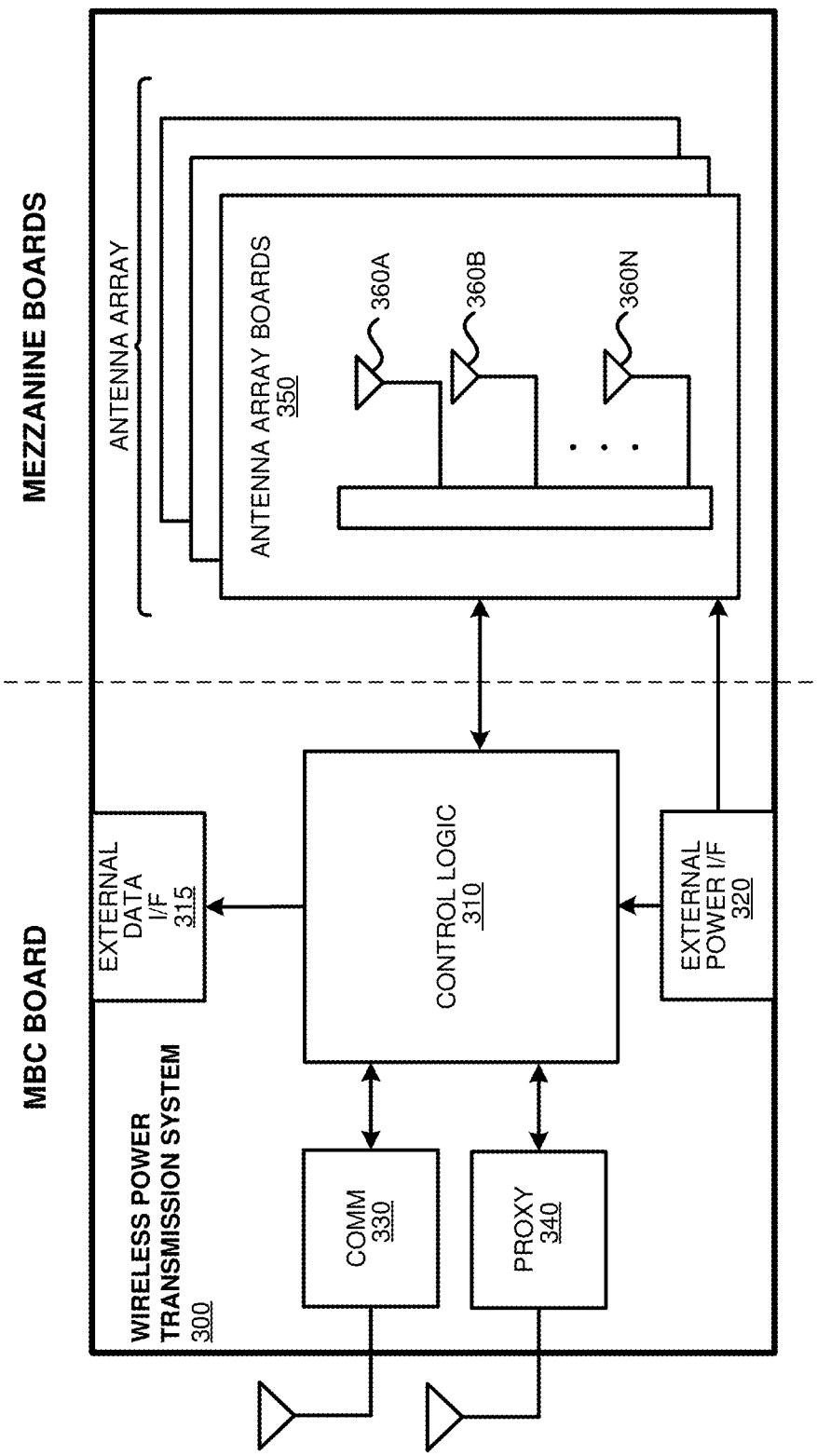
FIG. 3 depicts a block diagram illustrating example components of a wireless power transmission system in accordance with some embodiments.

FIG. 3 is a block diagram illustrating example components of a wireless power transmission system 300, in accordance with an embodiment. As illustrated in the example of FIG. 3, the wireless charger 300 includes a master bus controller (MBC) board and multiple mezzanine boards that collectively comprise the antenna array. The MBC includes control logic 310, an external data interface (I/F) 315, an external power interface (I/F) 320, a communication block 330 and proxy 340. The mezzanine (or antenna array boards 350) each include multiple antennas 360*a*-360*n*. Some or all of the components can be omitted in some embodiments. Additional components are also possible. For example, in some embodiments only one of communication block 330 or proxy 340 may be included.

The control logic 310 is configured to provide control and intelligence to the array components. The control logic 310 may comprise one or more processors, FPGAs, memory units, etc., and direct and control the various data and power communications. The communication block 330 can direct data communications on a data carrier frequency, such as the base signal clock for clock synchronization. The data communications can be Bluetooth™ Wi-Fi™, ZigBee™, etc., including combinations or variations thereof. Likewise, the proxy 340 can communicate with clients via data communications as discussed herein. The data communications can be, by way of example and not limitation, Bluetooth™, Wi-Fi™ ZigBee™, etc. Other communication protocols are possible.

In some embodiments, the control logic 310 can also facilitate and/or otherwise enable data aggregation for Internet of Things (IoT) devices. In some embodiments, wireless power receiver clients can access, track and/or otherwise obtain IoT information about the device in which the wireless power receiver client is embedded and provide that IoT information to the wireless power transmission system 300 over a data connection. This IoT information can be provided to via an external data interface 315 to a central or cloud-based system (not shown) where the data can be aggregated, processed, etc. For example, the central system can process the data to identify various trends across geographies, wireless power transmission systems, environments, devices, etc. In some embodiments, the aggregated data and or the trend data can be used to improve operation of the devices via remote updates, etc. Alternatively, or additionally, in some embodiments, the aggregated data can be provided to third party data consumers. In this manner, the wireless power transmission system acts as a Gateway or Enabler for the IoTs. By way of example and not limitation, the IoT information can include capabilities of the device in which the wireless power receiver client is embedded, usage information of the device, power levels of the device, information obtained by the device or the wireless power receiver client itself, e.g., via sensors, etc.

The external power interface 320 is configured to receive external power and provide the power to various components. In some embodiments, the external power interface 320 may be configured to receive a standard external 24 Volt power supply. In other embodiments, the external power interface 320 can be, for example, 120/240 Volt AC mains to an embedded DC power supply which sources the required 12/24/48 Volt DC to provide the power to various components. Alternatively, the external power interface could be a DC supply which sources the required 12/24/48 Volts DC. Alternative configurations are also possible.

In operation, the master bus controller (MBC), which controls the wireless power transmission system 300, receives power from a power source and is activated. The MBC then activates the proxy antenna elements on the wireless power transmission system and the proxy antenna elements enter a default "discovery" mode to identify available wireless receiver clients within range of the wireless power transmission system. When a client is found, the antenna elements on the wireless power transmission system power on, enumerate, and (optionally) calibrate.

The MBC then generates beacon transmission scheduling information and power transmission scheduling information during a scheduling process. The scheduling process includes selection of power receiver clients. For example, the MBC can select power receiver clients for power transmission and generate a Beacon Beat Schedule (BBS) cycle and a Power Schedule (PS) for the selected wireless power receiver clients. As discussed herein, the power receiver clients can be selected based on their corresponding properties and/or requirements.

In some embodiments, the MBC can also identify and/or otherwise select available clients that will have their status queried in the Client Query Table (CQT). Clients that are placed in the CQT are those on "standby", e.g., not receiving a charge. The BBS and PS are calculated based on vital information about the clients such as, for example, battery status, current activity/usage, how much longer the client has until it runs out of power, priority in terms of usage, etc.

The Proxy AE broadcasts the BBS to all clients. As discussed herein, the BBS indicates when each client should send a beacon. Likewise, the PS indicates when and to which clients the array should send power to and when clients should listen for wireless power. Each client starts broadcasting its beacon and receiving power from the array per the BBS and PS. The Proxy can concurrently query the Client Query Table to check the status of other available clients. In some embodiments, a client can only exist in the BBS or the CQT (e.g., waitlist), but not in both. The information collected in the previous step continuously and/or periodically updates the BBS cycle and/or the PS.

Figure 4:
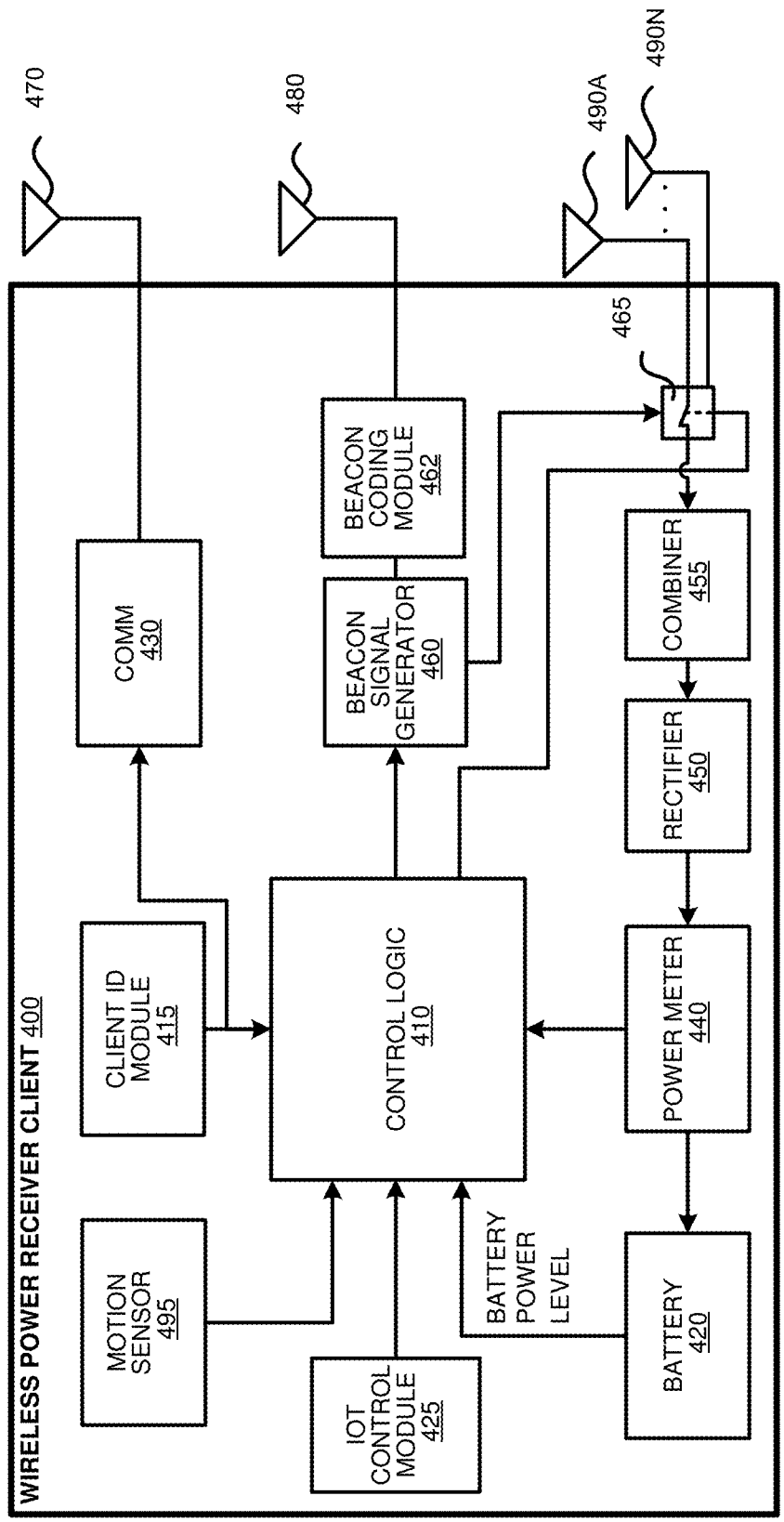
FIG. 4 depicts a block diagram illustrating example components of a wireless power receiver client in accordance with some embodiments.

FIG. 4 is a block diagram illustrating example components of a wireless power receiver client, in accordance with some embodiments. As illustrated in the example of FIG. 4, the receiver 400 includes control logic 410, battery 420, an IoT control module 425, communication block 430 and associated antenna 470, power meter 440, rectifier 450, a combiner 455, beacon signal generator 460, beacon coding unit 462 and an associated antenna 480, and switch 465 connecting the rectifier 450 or the beacon signal generator 460 to one or more associated antennas 490a-n. Some or all of the components can be omitted in some embodiments. For example, in some embodiments, the wireless power receiver client does not include its own antennas but instead utilizes and/or otherwise shares one or more antennas (e.g., Wi-Fi antenna) of the wireless device in which the wireless power receiver client is embedded. Moreover, in some embodiments, the wireless power receiver client may include a single antenna that provides data transmission functionality as well as power/data reception functionality. Additional components are also possible.

A combiner 455 receives and combines the received power transmission signals from the power transmitter in the event that the receiver 400 has more than one antenna. The combiner can be any combiner or divider circuit that is configured to achieve isolation between the output ports while maintaining a matched condition. For example, the combiner 455 can be a Wilkinson Power Divider circuit. The rectifier 450 receives the combined power transmission signal from the combiner 455, if present, which is fed through the power meter 440 to the battery 420 for charging. The power meter 440 can measure the received power signal strength and provides the control logic 410 with this measurement.

The control logic 410 can receive the battery power level from the battery 420 itself. The control logic 410 may also transmit/receive via the communication block 430 a data signal on a data carrier frequency, such as the base signal clock for clock synchronization. The beacon signal generator 460 generates the beacon signal, or calibration signal, transmits the beacon signal using either the antenna 480 or 490 after the beacon signal is encoded.

It may be noted that, although the battery 420 is shown as charged by, and providing power to, the receiver 400, the receiver may also receive its power directly from the rectifier 450. This may be in addition to the rectifier 450 providing charging current to the battery 420, or in lieu of providing charging. Also, it may be noted that the use of multiple antennas is one example of implementation and the structure may be reduced to one shared antenna.

In some embodiments, the control logic 410 and/or the IoT control module 425 can communicate with and/or otherwise derive IoT information from the device in which the wireless power receiver client 400 is embedded. Although not shown, in some embodiments, the wireless power receiver client 400 can have one or more data connections (wired or wireless) with the device in which the wireless power receiver client 400 is embedded over which IoT information can be obtained. Alternatively, or additionally, IoT information can be determined and/or inferred by the wireless power receiver client 400, e.g., via one or more sensors. As discussed above, the IoT information can include, but is not limited to, information about the capabilities of the device in which the wireless power receiver client is embedded, usage information of the device in which the wireless power receiver client is embedded, power levels of the battery or batteries of the device in which the wireless power receiver client is embedded, and/or information obtained or inferred by the device in which the wireless power receiver client is embedded or the wireless power receiver client itself, e.g., via sensors, etc.

In some embodiments, a client identifier (ID) module 415 stores a client ID that can uniquely identify the power receiver client in a wireless power delivery environment. For example, the ID can be transmitted to one or more wireless power transmission systems when communication is established. In some embodiments, power receiver clients may also be able to receive and identify other power receiver clients in a wireless power delivery environment based on the client ID.

An optional motion sensor 495 can detect motion and signal the control logic 410 to act accordingly. For example, a device receiving power may integrate motion detection mechanisms such as accelerometers or equivalent mechanisms to detect motion. Once the device detects that it is in motion, it may be assumed that it is being handled by a user, and would trigger a signal to the array to either to stop transmitting power, or to lower the power transmitted to the device. In some embodiments, when a device is used in a moving environment like a car, train or plane, the power might only be transmitted intermittently or at a reduced level unless the device is critically low on power.

Figure 5A:
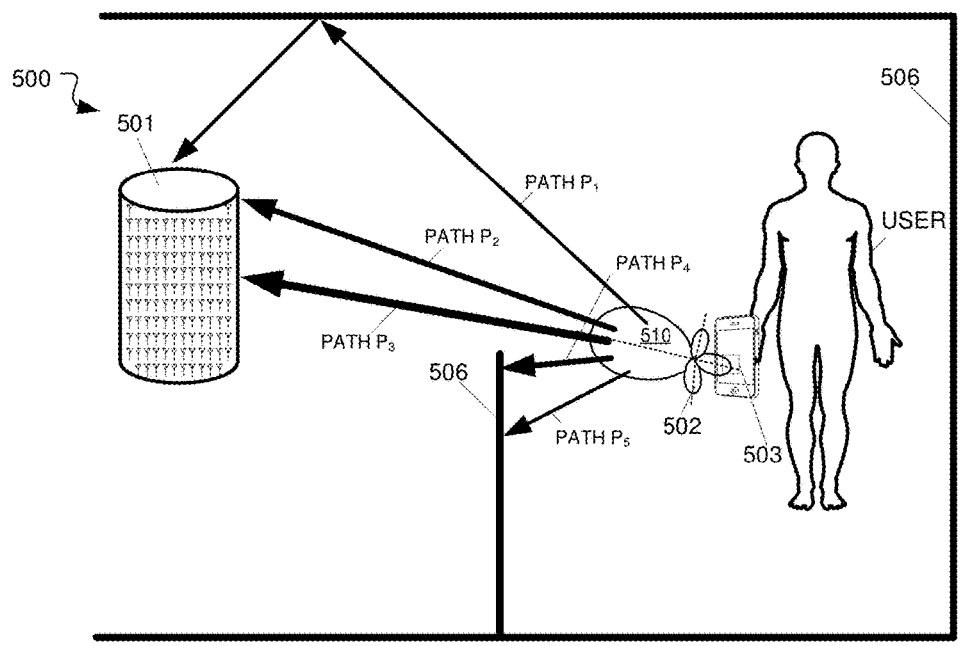
FIGS. 5A and 5B depict diagrams illustrating an example multipath wireless power delivery environment in accordance with some embodiments.
Figure 5B:
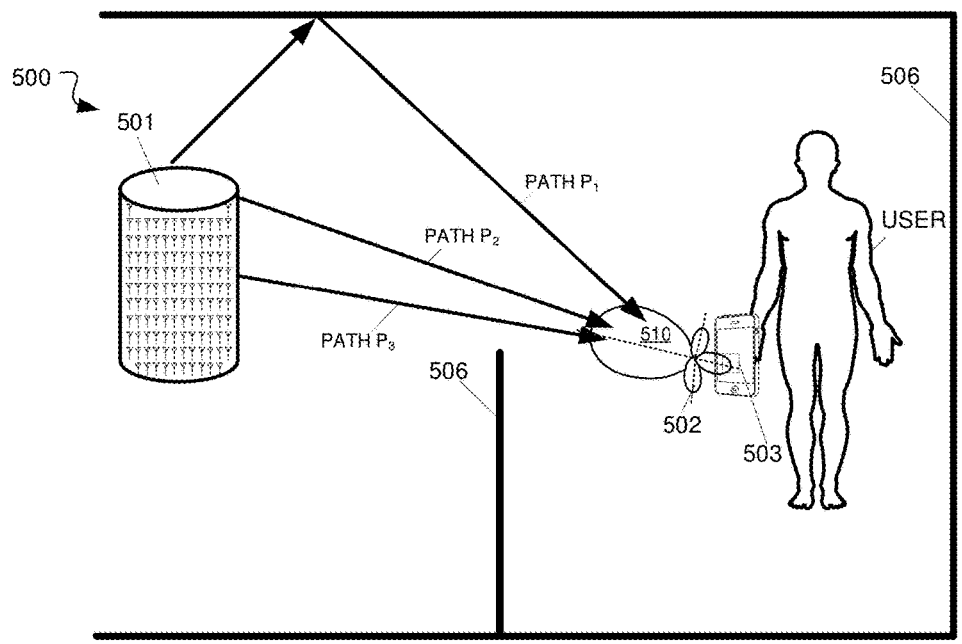

FIGS. 5A and 5B depict diagrams illustrating an example multipath wireless power delivery environment 500, according to some embodiments. The multipath wireless power delivery environment 500 includes a user operating a wireless device 502 including one or more wireless power receiver clients 503. The wireless device 502 and the one or more wireless power receiver clients 503 can be wireless device 102 of FIG. 1 and wireless power receiver client 103 of FIG. 1 or wireless power receiver client 400 of FIG. 4, respectively, although alternative configurations are possible. Likewise, wireless power transmission system 501 can be wireless power transmission system 101 FIG. 1 or wireless power transmission system 300 of FIG. 3, although alternative configurations are possible. The multipath wireless power delivery environment 500 includes reflective objects 506 and various absorptive objects, e.g., users, or humans, furniture, etc.

Wireless device 502 includes one or more antennas (or transceivers) that have a radiation and reception pattern 510 in three-dimensional space proximate to the wireless device 102. The one or more antennas (or transceivers) can be wholly or partially included as part of the wireless device 102 and/or the wireless power receiver client (not shown). For example, in some embodiments one or more antennas, e.g., Wi-Fi, Bluetooth, etc. of the wireless device 502 can be utilized and/or otherwise shared for wireless power reception. As shown in the example of FIGS. 5A and 5B, the radiation and reception pattern 510 comprises a lobe pattern with a primary lobe and multiple side lobes. Other patterns are also possible.

The wireless device 502 transmits a beacon (or calibration) signal over multiple paths to the wireless power transmission system 501. As discussed herein, the wireless device 502 transmits the beacon in the direction of the radiation and reception pattern 510 such that the strength of the received beacon signal by the wireless power transmission system, e.g., RSSI, depends on the radiation and reception pattern 510. For example, beacon signals are not transmitted where there are nulls in the radiation and reception pattern 510 and beacon signals are the strongest at the peaks in the radiation and reception pattern 510, e.g., peak of the primary lobe. As shown in the example of FIG. 5A, the wireless device 502 transmits beacon signals over five paths P1-P5. Paths P4 and P5 are blocked by reflective and/or absorptive object 506. The wireless power transmission system 501 receives beacon signals of increasing strengths via paths P1-P3. The bolder lines indicate stronger signals. In some embodiments the beacon signals are directionally transmitted in this manner to, for example, avoid unnecessary RF energy exposure to the user.

A fundamental property of antennas is that the receiving pattern (sensitivity as a function of direction) of an antenna when used for receiving is identical to the far-field radiation pattern of the antenna when used for transmitting. This is a consequence of the reciprocity theorem in electromagnetics. As shown in the example of FIGS. 5A and 5B, the radiation and reception pattern 510 is a three-dimensional lobe shape. However, the radiation and reception pattern 510 can be any number of shapes depending on the type or types, e.g., horn antennas, simple vertical antenna, etc. used in the antenna design. For example, the radiation and reception pattern 510 can comprise various directive patterns. Any number of different antenna radiation and reception patterns are possible for each of multiple client devices in a wireless power delivery environment.

Referring again to FIG. 5A, the wireless power transmission system 501 receives the beacon (or calibration) signal via multiple paths P1-P3 at multiple antennas or transceivers. As shown, paths P2 and P3 are direct line of sight paths while path P1 is a non-line of sight path. Once the beacon (or calibration) signal is received by the wireless power transmission system 501, the power transmission system 501 processes the beacon (or calibration) signal to determine one or more receive characteristics of the beacon signal at each of the multiple antennas. For example, among other operations, the wireless power transmission system 501 can measure the phases at which the beacon signal is received at each of the multiple antennas or transceivers.

The wireless power transmission system 501 processes the one or more receive characteristics of the beacon signal at each of the multiple antennas to determine or measure one or more wireless power transmit characteristics for each of the multiple RF transceivers based on the one or more receive characteristics of the beacon (or calibration) signal as measured at the corresponding antenna or transceiver. By way of example and not limitation, the wireless power transmit characteristics can include phase settings for each antenna or transceiver, transmission power settings, etc.

As discussed herein, the wireless power transmission system 501 determines the wireless power transmit characteristics such that, once the antennas or transceivers are configured, the multiple antennas or transceivers are operable to transit a wireless power signal that matches the client radiation and reception pattern in the three-dimensional space proximate to the client device. FIG. 5B illustrates the wireless power transmission system 501 transmitting wireless power via paths P1-P3 to the wireless device 502. Advantageously, as discussed herein, the wireless power signal matches the client radiation and reception pattern 510 in the three-dimensional space proximate to the client device. Said another way, the wireless power transmission system will transmit the wireless power signals in the direction in which the wireless power receiver has maximum gain, e.g., will receive the most wireless power. As a result, no signals are sent in directions in which the wireless power receiver cannot receiver, e.g., nulls and blockages. In some embodiments, the wireless power transmission system 501 measures the RSSI of the received beacon signal and if the beacon is less than a threshold value, the wireless power transmission system will not send wireless power over that path.

The three paths shown in the example of FIGS. 5A and 5B are illustrated for simplicity, it is appreciated that any number of paths can be utilized for transmitting power to the wireless device 502 depending on, among other factors, reflective and absorptive objects in the wireless power delivery environment.

II. Wireless Power Delivery Scheduling

Figure 6:
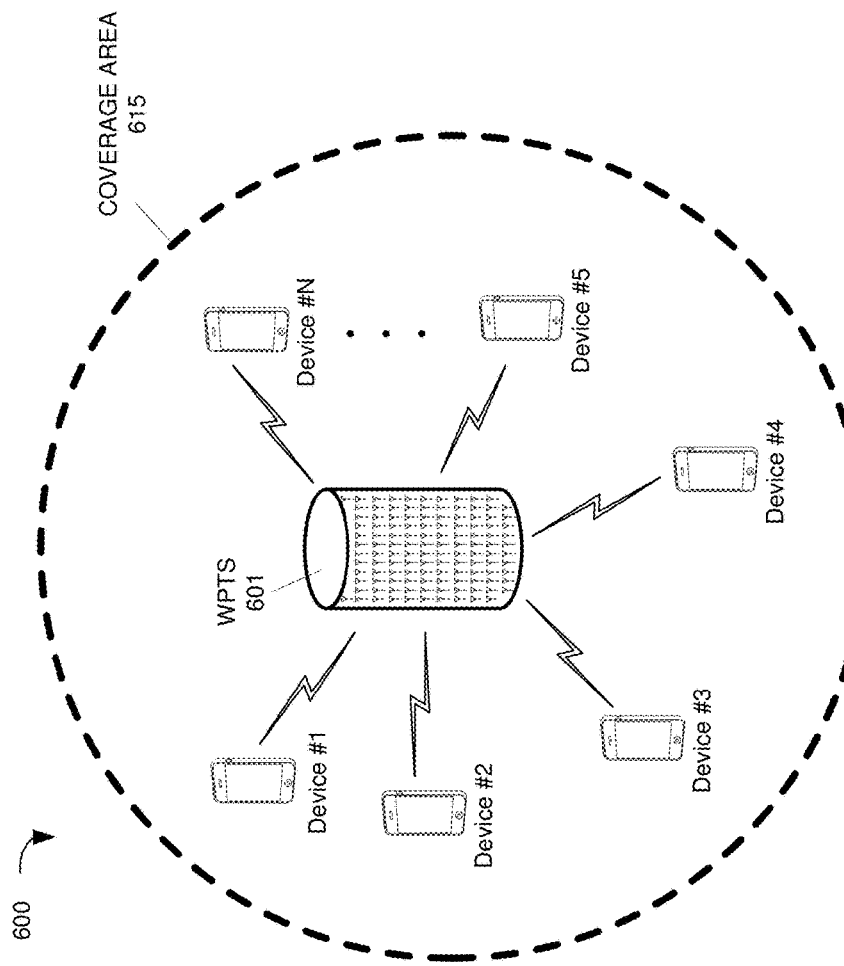
FIG. 6 depicts a diagram illustrating an example wireless power delivery environment in accordance with some embodiments.

FIG. 6 depicts a diagram illustrating an example wireless power delivery environment 600, according to some embodiments. The example wireless power delivery environment 600 includes a wireless power transmission system 601 and multiple devices 1-N located within wireless power delivery range (or wireless power coverage area) 615 of the wireless power transmission system 601. The wireless power transmission system 601 can, among other features, generate an adaptive wireless power delivery schedule for providing power to receivers within or associated with devices 1-N. Needs-based and pattern-based schedule generation are discussed herein, however, other scheduling generation techniques are also possible including combination or variations thereof.

The wireless power transmission system 601 can be wireless power transmission system 101 of FIG. 1 or wireless power transmission system 300 of FIG. 3 although alternative configurations are possible. As discussed herein, the devices 1-N can be, for example, wireless devices 102 of FIG. 1 each including one or more wireless power receiver clients. The wireless power receiver clients can be a wireless power receiver client 103 of FIG. 1 or a wireless power receiver client 400 of FIG. 4 although alternative configurations are possible. To further illustrate the operation of the wireless power transmission system 601 and the example devices 1-N, the following figures provided.

A. Needs-Based Power Delivery Scheduling

Figure 7:
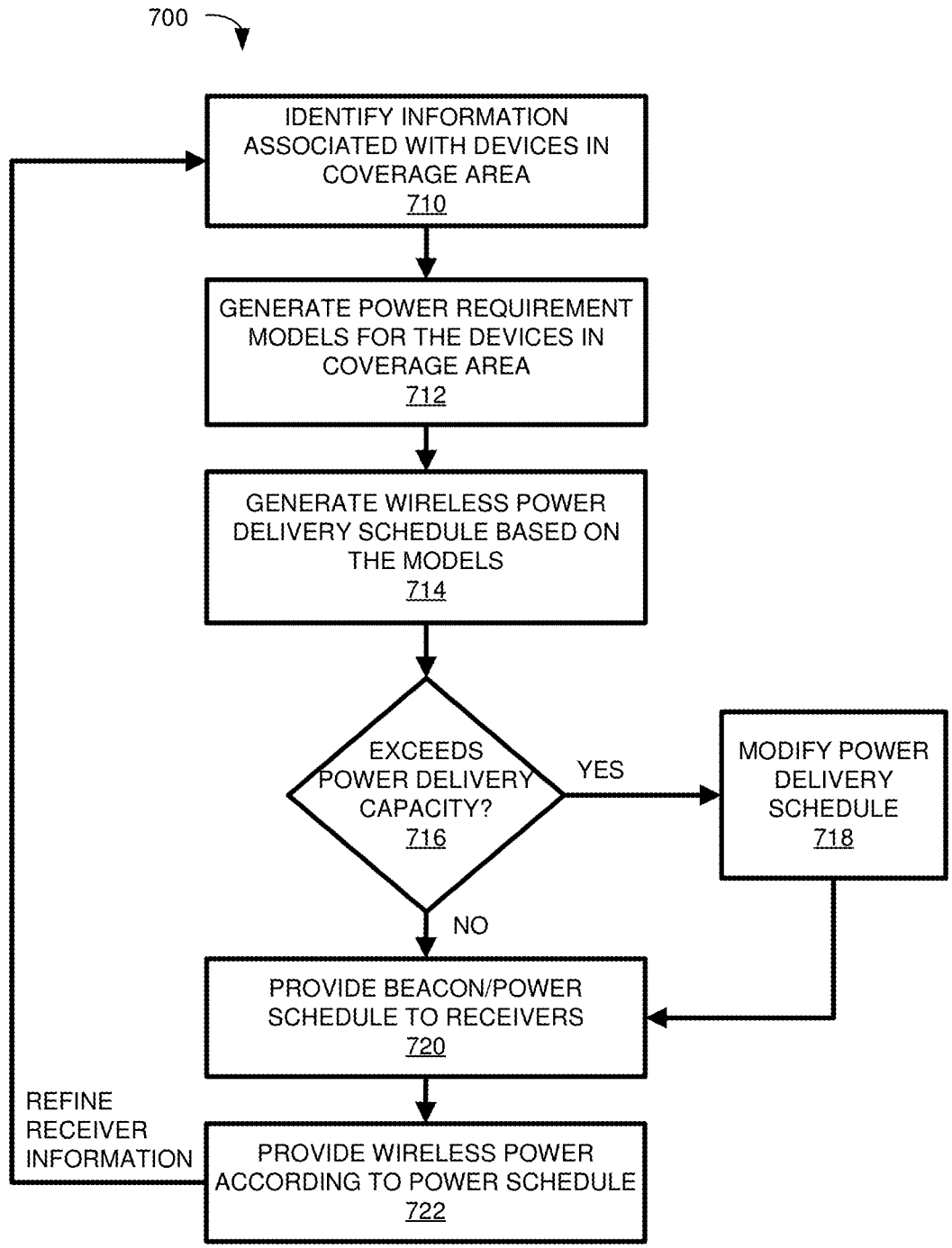
FIG. 7 depicts a flow diagram illustrating an example process for generating an adaptive wireless power delivery schedule for a wireless power transmission system in a wireless power delivery environment and providing wireless power according to the schedule in accordance with some embodiments.

FIG. 7 depicts a flow diagram illustrating an example process 700 for generating an adaptive wireless power delivery schedule for a wireless power transmission system in a wireless power delivery environment and providing wireless power according to the schedule, according to some embodiments. More specifically, the example process 700 illustrates generating a needs-based adaptive wireless power delivery schedule for a wireless power transmission system. A wireless power transmission system such as, for example, wireless power transmission system 601 of FIG. 6 or wireless power transmission system 101 of FIG. 1 can, among other functions, perform example process 700.

To begin, at an information gathering process 710, the wireless power transmission system identifies and/or otherwise gathers information associated with the devices within the wireless power coverage area. In some embodiments, the information gathering process includes identifying the types and number of devices located within the coverage region. Additionally, the information associated with the devices can include battery and usage parameters. Depending on information available to the devices and permissions to share the information, the data collected by the wireless power transmission system may include, for example, location information, current power usage levels, etc. An example of the information gathering process 710 is shown and discussed in greater detail with reference to FIG. 8A.

After device data discovery has been accomplished, at a model generation process 712, the wireless power transmission system uses the information associated with the receivers to generate one or more power requirement models for the receivers in the coverage area. An example of a model generation process 712 is shown and discussed in greater detail with reference to FIG. 9.

At process 714, the wireless power transmission system generates an adaptive wireless power delivery schedule based on the models which balances the needs of the devices. Examples of this process 714 may include a situation where most of the devices within a coverage area or region are transitory in nature. Such situations could exist, for example, in a coffee shop where customers come in, purchase a beverage, and often sit for a while to relax or socialize. In such embodiments, the customer devices may be ranked with highest priority and the minimum thresholds may be set to approximately 30 percent for all devices. That is, devices that drop below this threshold are provided power until the threshold is met, after which devices may be supplied power evenly. Resident devices, such as a door chime, a thermostat, etc., may have a very low threshold as they can receive power at off time, e.g., when the shop is closed and no other devices are present.

In another example, the coverage region may be within a home. In this situation, the devices are mostly known and the relative priority of the devices, usage rates, and patterns are likely well understood. As such, in this example, rather than blanket thresholds, each device within the home may be assigned a personal minimum threshold. For the above example of the tablet, the threshold may be low, say 15 percent of total battery capacity, until midnight to 7:00 am. During this period the minimum threshold may raise to 90 percent in order to meet the user's needs. The relative differential between the power levels of the devices, and the threshold level, may be utilized to distribute power accordingly.

After the powering schedule has been generated for the coverage region 615, at decision process 716, the wireless power transmission system determines if it has the capacity to deliver power to each of the devices as required by the schedule. In some cases, the power requirements of the devices in the environment may exceed the capabilities of the wireless power transmission system. In such situations, the wireless power transmission system has two options: 1) provide insufficient service to all devices within the coverage region, or 2) meet the requirements of some devices within the coverage region by sacrificing other devices. Depending on the scenario, one means of dealing with under capacity may be preferable. In some embodiments, a user may be able to, for example, select or configure the wireless power transmission system on how to handle these situations.

However, as shown in the example of FIG. 7, if the power exceeds power delivery capacity then, at process 718, the wireless power transmission system modifies the power delivery schedule. In some embodiments, a default mechanism for handling capacity limitations can include sacrificing specific devices in order to supply other devices adequate service. Accordingly, in some embodiments, the wireless power transmission system modifies the power delivery schedule to sacrifice selected devices. Determining which devices are to be sacrificed may be determined through optimization of a number of weighted factors. For example, device type, importance, usage patterns, and power delivery efficiency may all be combined via a weighted average for each device. Lowest ranking devices may then be selected for sacrifice.

An example of this process could be a home setting where the above described tablet, a fire alarm, and the user's mobile phone are all present and competing for power. In this example, the fire alarm, despite being a resident device, has a very high priority level due to the safety provided by this device (as opposed to merely convenience). The battery level of the fire alarm is at 45 percent currently. The tablet has not been plugged in by the user, and neither has the mobile phone. However, due to low usage the day before, the tablet has significantly more charge than normal, at say 50 percent. Whereas the mobile phone is nearly depleted, at approximately 20 percent.

The minimum threshold for the fire alarm can be set to approximately 50 percent as a default setting. The tablet, however, due to the unusual usage pattern has a high threshold between midnight and 7:00 A.M. of 90 percent. The mobile phone has a middle threshold of 70 percent in this given example. Given merely the difference between the actual charge and the thresholds, the mobile phone would receive charge first, followed by the tablet and fire alarm. However, in this example, the array recognizes that only half the required charging capacity is available for these devices. Thus, one or more devices are sacrificed in order to provide sufficient service to the remaining devices.

Based on the differential between the threshold and the actual power levels, the mobile phone appears to have the largest powering requirements; however, the determination of which devices to sacrifice is not based just upon power requirements, but the additional factors of device type and power delivery efficiency. Here, even though the fire alarm apparently has the lowest need for power (a 45 percent charge could last months for this low power device), the type of device (a safety issue) trumps the other factors.

Thus, the wireless power transmission system now needs to determine which of mobile phone or tablet to sacrifice. In this example these devices are relatively equal in terms of priority (although these priorities may be configurable by a user in some embodiments). However, in this example, the mobile phone has also been left in the coat pocket of the user, which has been placed in a coat closet far from the charger array. In contrast, the tablet was left on a desk proximate to the charger. Through test cycles, the charger is able to determine the charging efficiency of the tablet is orders of magnitude higher than the phone. Indeed, by 7:00 A.M. the next morning if provided continuous power delivery, the anticipated power levels of the tablet would be above 90 percent, however the phone would only be around 60 percent. In this situation, even though the phone has the largest need for power, it may be sacrificed by the charger in order to provide adequate service to the remaining devices.

Regardless of whether the power delivery schedule needs to be modified, e.g., devices need to be sacrificed, at process 720, the wireless power transmissions system provides the beacon and/or power schedule to the receivers and, at process 722, provides the power according to the transmission schedule as discussed herein. As power is delivered, the wireless power transmission system refines the receiver information by continuing to identify and/or otherwise gather information associated with the receivers within the wireless power coverage area. For example, particularly pertinent information can include addition or removal of devices from the coverage region, changing charge levels in relation to the power delivered, and any additional device information (battery type, model type, usage level changes, etc.).

The above needs-based power scheduling is dependent upon some basic level of information regarding the devices located within the array coverage region. This works particularly well when the array is deployed within a home or business where the devices are owned by the array owner, or are otherwise registered within the system. However, in cases where the array services the public, much less device information may be available. Indeed, in a public setting, none of the information related to determining time-to-death may be available (device type, model type, battery type, usage rates, etc.). Indeed, in such situations, the only thing being transmitted by the receivers may be a beacon request for power and current battery charge level.

In such situations, it may still be desirable to deliver power based upon perceived device needs; however, here the battery charge level alone must be utilized as a proxy for actual device need. Such a system is less accurate and responsive to actual device power requirements, however may be the best solution possible given the systems lack of information.

Figure 8A:
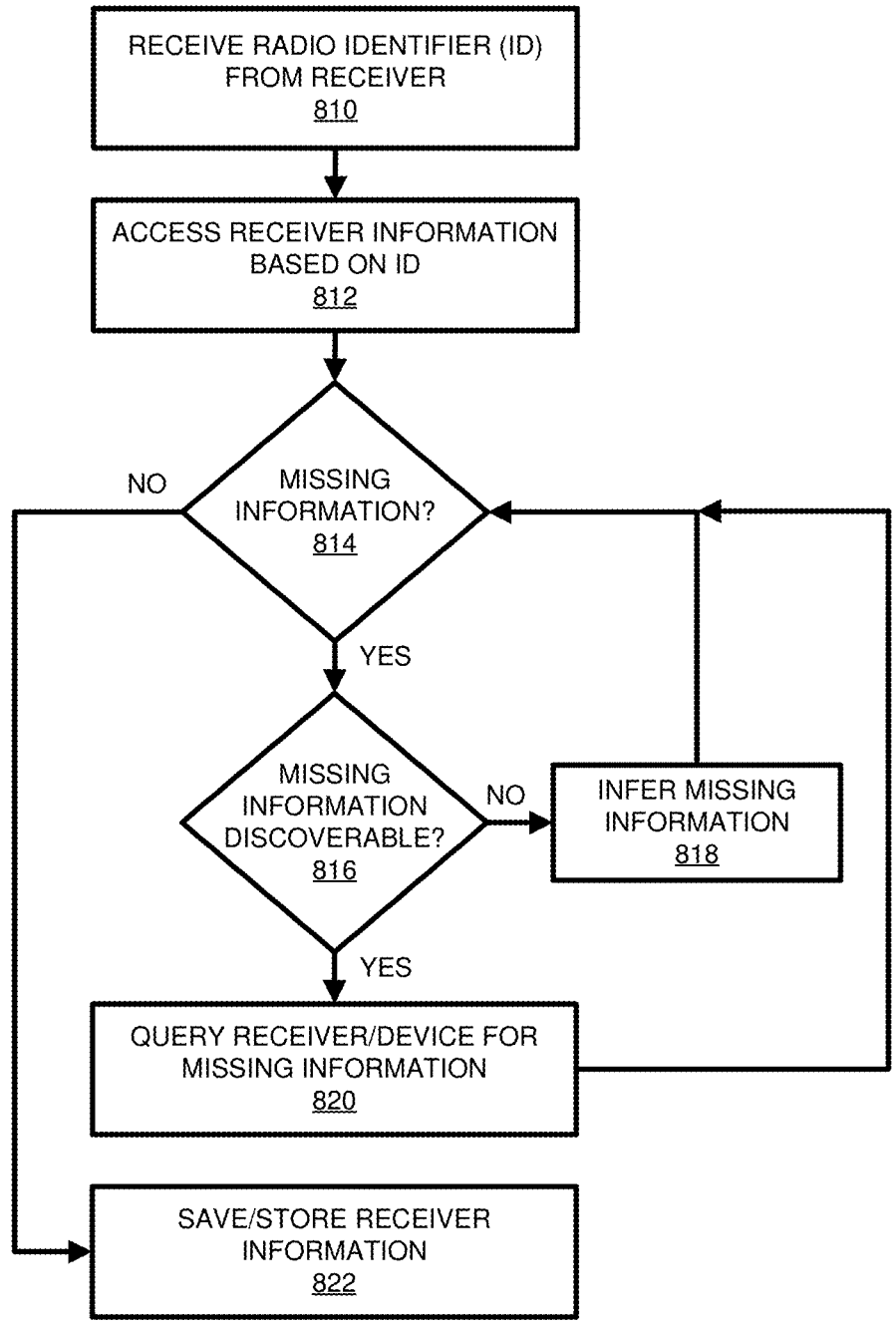
FIG. 8A depicts a flow diagram illustrating an example information gathering process in accordance with some embodiments.

FIG. 8A depicts a flow diagram illustrating an example information gathering process 800A, according to some embodiments. As discussed above, the example information gathering process 800A can be a more detailed example of information gathering process 710 of FIG. 7 although alternative configurations are possible. A wireless power transmission system such as, for example, wireless power transmission system 601 of FIG. 6 or wireless power transmission system 101 of FIG. 1 can, among other functions, perform example process 800A.

To begin, at process 810, the wireless power transmission system receives or collects radio identifiers (IDs) from the various receivers. As previously noted, each radio can include a unique ID that can, for example, be determined by the manufacturer during production. If the receiver and device are linked to this ID, then information regarding the receiver and device may be readily ascertained via this single ID. At process 812, the wireless power transmission system accesses receiver information that it may have using the ID. For example, the radio ID can be used to cross-reference any known information regarding the device.

The wireless power transmission system processes the information and, at decision process 814, if the wireless power transmission system can ascertain the information that it needs to generate a power requirement model for a particular receiver associated with an ID then the wireless power transmission system can save or store the receiver information at process 822 and cease the information gathering process for the associated receiver. However, is some of the pertinent data is unavailable via a lookup by the radio ID and/or otherwise missing, then at decision process 816, the wireless power transmission system determines if the missing information is discoverable for the particular device.

As discussed herein, in some instances wireless power receivers can have limited data connectivity with the device in which they are embedded or to which they otherwise provide power. In such instances, information such as device power utilization may not be available. Additionally, in other embodiments, such data may be available to the wireless power receiver, but the receiver may not be configured to, or permitted to, share this information with the wireless power transmission system. This may be particularly true when the wireless power transmission system and the device are not owned or operated by the same user (such as in a business setting). In such environments, the user may configure their device privacy settings such that this data is not shared.

If the missing information is not discoverable, the wireless power transmission system, at process 818, infers the missing information. For example, the wireless power transmission system can infer the missing information based upon prototypical values, at process 818. Inferring the missing information, at process 818, can vary based on information available regarding the device. For example, if the device is known to be a smartphone, but with no specific brand data, power utilization may be set to a different value than if the brand and/or model of the phone is known. Likewise, if the phone is actively transmitting (suggesting that the user is engaged in an active call), the power consumption inference may differ from a phone at idle. In addition to power usage rates, other information may be inferred, such as, for example, device location, existing battery levels, battery type, etc.

However, if the missing information is discoverable, at process 820, the wireless power transmission system queries the receiver and/or the device for the missing information. Getting the data in this manner is often preferred to inferring the data as the possibility of erroneous values is minimized and there is less processing required by the charger. Additionally, once actual data is known for a given device, the data may be stored for future use by the wireless power transmission system (and/or within a cloud based analytics system) for future retrieval.

As discussed herein, a critical factor for scheduling based upon device power needs is the battery level of the receiver (and in some embodiments the main battery within the device). In some receivers, there is the ability to transfer device information data, including battery levels. In other systems, as previously identified, the receiver is incapable of directly ascertaining device power. In such systems, the battery level of the device is rather inferred. This inference may be based upon knowledge of the device type (classification), as well as monitoring the amount of power collected by the receiver.

Figure 8B:
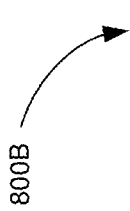
FIG. 8B depicts a device classification table illustrating example power usage and response classifications of various devices in accordance with some embodiments.

FIG. 8B depicts a device classification table 800B illustrating example power usage and response classifications of various devices, according to some embodiments. As discussed herein, classification can be utilized to help infer missing information in cases where the missing information is not discoverable, e.g., process 818 of FIG. 8A. As illustrated in the example of FIG. 8B, each device can be classified based on a pre-defined response to reaching a power threshold. The device classification table 800 can include varying levels of detail (e.g., about a device battery) that is searchable based on the device identifier. For example, the table may be based on certified devices. In such cases, a manufacturer's numbers, coded device numbers, MAC address, URL or GUID, etc., can be used to classify or identify the wireless device and/or the wireless device's battery. In some embodiments, the classifications can be very granular, e.g., manufacturer and model number or simply a manufacturer. For example, a mobile smartphone device could be classified as a Samsung S4 or merely a Samsung phone.

In some embodiments, the first two to four bytes transmitted from the wireless device to the charger during wireless power transmission provisioning include a coded system, a manufacturer's device, a manufacturer OM number, or a specific device number (e.g., make and/or model number, device number). For example, the information can be exchanged during a discovery exchange that happens when a device joins the charger after it finishes going through a 'I'm going to pick you as my charger' (e.g., a handshake and selection protocol). The device then shares its information about itself, from the device number standpoint. The charger can then do a backend look-up given the device number. The lookup information can indicate, for example, characteristics of batteries in the device and/or the charge curve of the battery in the device. The lookup may occur via a table or database stored in the charger, or the charger can use a communication link to access the information from a remote location (e.g. via a data database accessible via the Internet and a known URL). The system may also determine a time of day associated with the discovery exchange, and provide a higher weighting to a new wireless device, which may need power immediately (as opposed to a device that has been charging for an hour).

In some embodiments, the lookup table allows the charger system to determine if the device is, for example, a heavy charging user (e.g., using a laptop having a steep charge cure with a trickle charge after a given period of time). For example, based on the laptop type and the battery information, the charger would know that the trickle breaks over at 85 percent charge and the charge time to get from that 85 percent is a specified amount of time.

In some embodiments, a different battery may not conform to a typical constant curve, constant voltage. In such cases one or more voltage thresholds may be utilized such that the charger knows the status of the target device battery. For example, the charger would know if voltage A (e.g., 90 percent charged) and if the target device battery gets to voltage B (e.g., 95 percent charged), it will stop sending power because if target device battery gets to voltage C (e.g., 100 percent), the system could damage the battery. Overall, the charger can make better charging decisions by understanding the type of target device and charging needs of that target device in relation to other target devices.

Figure 9:
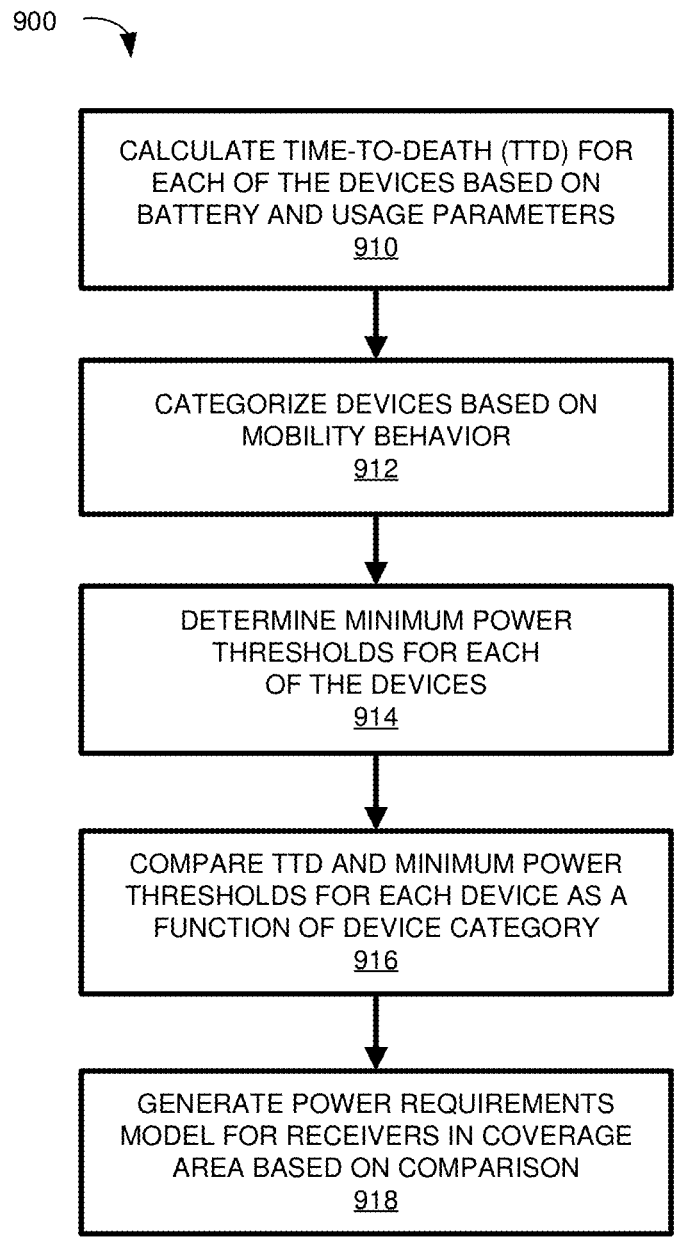
FIG. 9 depicts a flow diagram illustrating an example model generation process in accordance with some embodiments.

FIG. 9 depicts a flow diagram illustrating an example model generation process 900, according to some embodiments. As discussed above, the example model generation process 900 can be a more detailed example of information gathering process 712 of FIG. 7 although alternative configurations are possible. A wireless power transmission system such as, for example, wireless power transmission system 601 of FIG. 6 or wireless power transmission system 101 of FIG. 1 can, among other functions, perform example process 900. Alternatively or additionally, a cloud based analytics system can perform some or all of model generation process 900.

To begin, at process 910, the wireless power transmission system calculates the time-to-death (TTD) value for each of the devices based on battery and usage parameters. As discussed herein, the battery and usage parameters can include, for example, battery level, battery type, and consumption rate. The time-to-death value is a length of time before the battery for the device is depleted such that the device enters a hibernation state, or simply shuts down due to power loss. An example time to death calculation is provided below:

$$TTD = H\left(\frac{C \times (B_p - R)}{IH}\right)^k,$$

where:
TTD=time-to-death in hours;
H=the rated discharge time for the battery, which is derived from the battery type and a rated discharge rate;
C=the rated capacity at the rated discharge rate, which is also derived from the battery type;
I=The actual discharge rate in Amperes;
Bp=the percentage of battery currently charged;
R=the percentage reserve charge maintained on the battery before the device enters hibernation; which is derived from the device type; and
k=is the Peukert constant.

Using the above example equation, assume that a given device battery has a capacity of 1000 milliamp-hours (mAh). It is currently charged at 70 percent and at 3 percent the device enters the hibernation state. Thus, functionally the device has 67 percent of the battery remaining before time to death (670 milliamp-hours). The time to discharge for the rated discharge rate is 20 hours. The battery is a lithium ion type battery with a Peukert constant of around 1.29. Thus, if the device is reported as consuming 80 milliamps, it would function for 6.5 hours under the given conditions.

For the generation of a requirement model, this time based value is critically important due to how humans typically interact with these devices. For example, a user may not care that the charge on a remote control is merely 20 percent if the remote is guaranteed to operate for days still. In contrast, someone about to go to work may care that their phone is charged at 70 percent as the time-to-death may be less than the length of time they expect to be away from a source of power.

At process 912, the wireless power transmission system categorizes the devices based on mobility behavior. For example, a device that is stationary within the coverage region, e.g., a thermostat, may be classified as a 'resident' device. Resident devices often have the luxury of being powered at any time; therefore, their scheduling may be more flexible than other device types. Other devices may be classified as 'transitory' or 'predictable' based upon the models being employed. A 'transitory' device is a device where the usage and location behaviors are unknown. For example, a friend visiting a home network with a cell phone is typically an unpredictable event. The length the device will be within the coverage region and the next time it will be within coverage area may not be known. As such, a 'transitory' device can be provided greater priority during charging scheduling to accommodate their unpredictable behavior.

'Predictable' devices can be described as devices that may move within the coverage region, and even leave the coverage region, but maintain a pattern of behavior that the charger (or a backend cloud system) can recognize utilizing pattern recognition algorithms. For example, a user may take a tablet computing device to work on a set schedule of approximately 7:00 A.M. to 5:45 P.M. every Monday through Friday. Additionally, the user may charge the device with a wired charger every night between 11:00 P.M. to 6:30 A.M. Using this pattern information, the relative priority of the device can be determined in light of other clients' requirements. For example, at 10:00 P.M. the device may be at a relatively low charge and have an expected time-to-death of less than three hours. However, given the pattern data, the system may realize that the tablet device shall receive wired charging shortly, and therefore reduce its priority within the powering schedule. However, if at midnight the device has not been plugged in, the system realizes the usage pattern has deviated from the established pattern. In this example then, the tablet may be elevated to the highest priority as it is expected that the device will not be receiving power at 7:00 A.M. the next morning. Thus, the tablet may receive focused power for as long as possible in order to reduce the risk of being low on charge the next day.

After the device category has been determined, at process 914, the wireless power transmission system determines minimum time-to-power thresholds for each of the devices based on device utilization and/or type. The threshold determinations can be scalable depending upon the embodiment. In some cases, very broad aggregations of device types and thresholds may be generated. In such situations, the 'best' solution for the bulk of the receivers is typically met, and requires less data and pattern recognition/processing in order to determine. Other embodiments, however, may have far more complicated operations to determine minimum thresholds. In the most extreme examples, as discussed above with the tablet with known charging patterns, the minimum thresholds may be determined for each device individually, and may even change depending upon day or time.

At process 916, the wireless power transmission system compares the time-to-death and the minimum power thresholds for each device as a function of the associated device category. Lastly, at process 918, the wireless power transmission system generates the power requirements models for the receivers in the coverage area based on the comparison. For example, the comparison can include determining a differential between the time-to-death and the minimum power thresholds for the devices. The requirement models may be generated in aggregate for groups of device types, or may be more granular, even down to a powering profile for an individual device.

Figure 10:
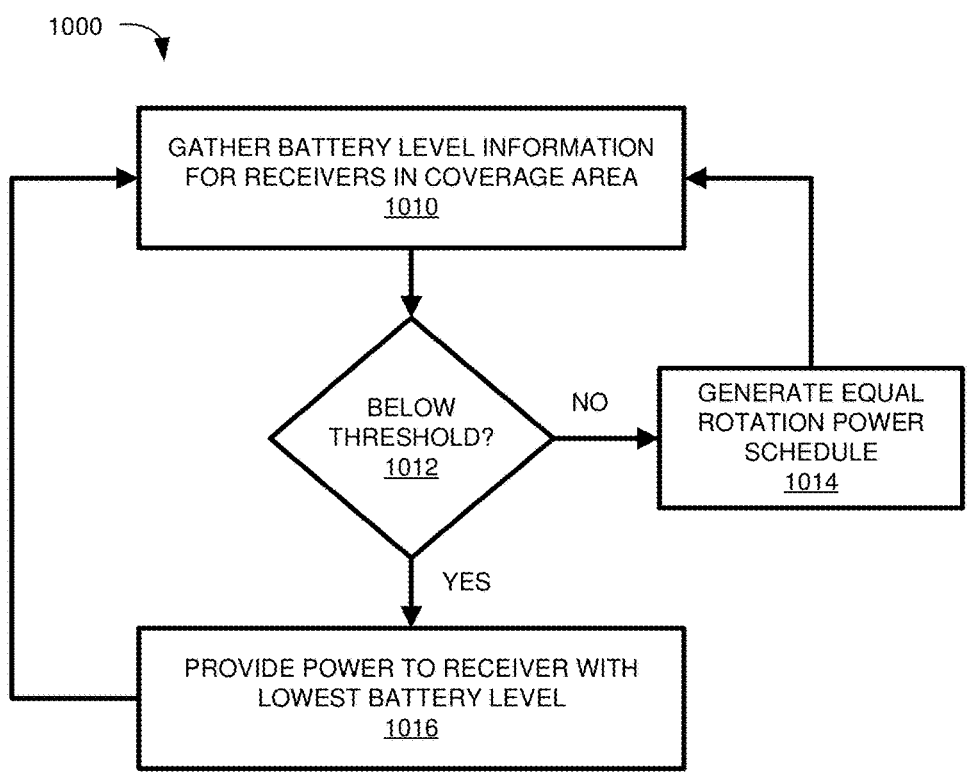
FIG. 10 depicts a flow diagram illustrating an example process for handling a limited data environment in accordance with some embodiments.

FIG. 10 depicts a flow diagram illustrating an example process 1000 for handling a limited data environment, according to some embodiments. The limited data environment can be the limited data environment discussed with respect to process 718 of FIG. 7, although alternative configurations are possible. A wireless power transmission system such as, for example, wireless power transmission system 601 of FIG. 6 or wireless power transmission system 101 of FIG. 1 can, among other functions, perform example process 1000. Alternatively, or additionally, a cloud based analytics system can perform some or all of model generation process 1000.

To begin, at process 1010, the wireless power transmission system gathers battery levels for each of the devices within the coverage region. Again, unlike earlier examples, the information available from the devices to the charger is limited in this example and, thus, battery level may be one of the only metrics available to the wireless power transmission system upon which to determine power requirements model.

At decision process 1012, the wireless power transmission system determines if any of the device battery level values are below a preset threshold value. Due to the lack of differentiation between the various devices types, the thresholds applied cannot be varied by device type, classification, or other factor. As such, a basic threshold of, for example, 40 percent of battery capacity may be universally applied to all devices.

At process 1016, the wireless power transmission system first provides devices below the present threshold value with wireless power. Once the power levels are above the minimum threshold, at process 1014, the wireless power transmission system can return to a state where the devices are provided equal power under a balanced powering rotation.

B. Pattern-Based Power Delivery Scheduling

Similar to needs-based power delivery scheduling discussed above, some embodiments may employ advanced usage based power models to predict optimal powering schedules for devices.

Figure 11:
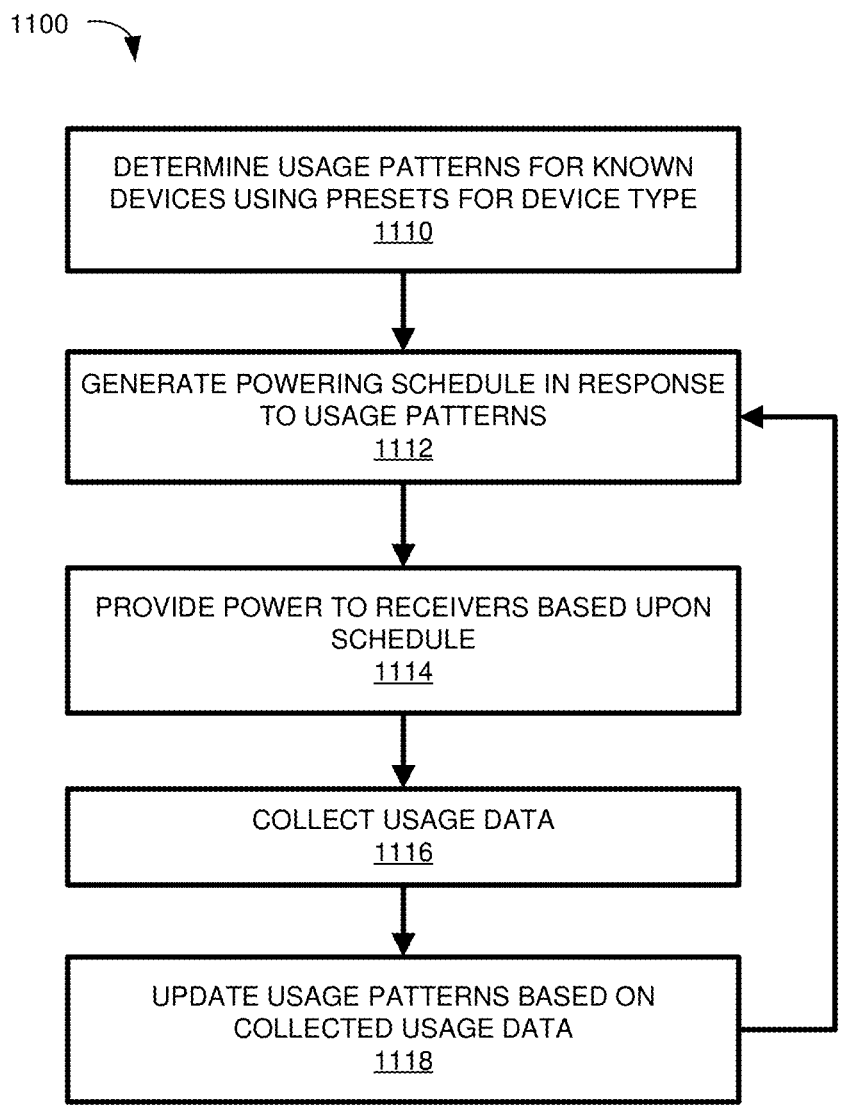
FIG. 11 depicts a flow diagram illustrating an example process for generating an adaptive wireless power delivery schedule for a wireless power transmission system in a wireless power delivery environment and providing wireless power according to the schedule in accordance with some embodiments.

FIG. 11 depicts a flow diagram illustrating an example process 1100 for generating an adaptive wireless power delivery schedule for a wireless power transmission system in a wireless power delivery environment and providing wireless power according to the schedule, according to some embodiments. More specifically, the example process 1100 illustrates generating a pattern-based adaptive wireless power delivery schedule for a wireless power transmission system. A wireless power transmission system such as, for example, wireless power transmission system 601 of FIG. 6 or wireless power transmission system 101 of FIG. 1 can, among other functions, perform example process 1100. Alternatively, or additionally, the advanced analytics required to derive the usage pattern also be performed in whole or in part by a cloud based system in communication with the wireless power transmission system.

In this example process 1100, the usage patterns for the devices are tabulated based upon preset valued according to the device type, at 1110. Thus, even within newly deployed systems, where no usage data has yet been compiled, a meaningful usage profile may be generated based upon 'typical' use patterns. For example, cell phone usage tends to peak at around 8:00 A.M. and again at noon and between 4-8 P.M. during the week. Usage patterns on the weekend, however, tend to skew later in the day, with reduced peaks in the morning. Lacking an actual use data, such profiles may be leveraged to predict device use.

The power schedule is then generated based upon these usage schedules, at 1112. For example, assume a user has recently deployed a wireless power transmission system within the home. The user has two cell-phones, a tablet computer, a smart thermostat, and a number of remote controllers for a gaming system within the coverage area of the wireless power transmission system. Example usage pattern for the cell phones are provided in the tables below. The tablet has a relatively consistent but moderate intensity usage throughout the day. However, usage between 8:00 A.M. to 11:00 A.M. tends to increase significantly. The remote controllers' typical usage is low throughout the week, but spike significantly on the weekend starting in the afternoon into the late evening. The thermostat power requirements, in contrast, are very stable and constant. In this example, the charger may develop a charging schedule where the phones are provided power in the early morning, before the lunch hour, and in the evenings. However, after 8:00 P.M. in the evening, power delivery to the phone may be dramatically reduced and instead supplied almost exclusively to the tablet device. On Friday, all devices may receive lower power levels while the remote controller batteries are recharged to a high threshold in anticipation of the heavy usage throughout the weekend. During lag (or low usage) periods, the thermostat and any particularly drained devices may be supplied energy.

At step 1114 power is provided to the various devices in accordance with the schedule. Such a system operates very well when a user's behaviors match a stereotypical use pattern, however everyone is different. In order for the charger to have effective usage based scheduling, these discrepancies from the stereotypical charging pattern must be identified and taken into account during the scheduling. To this end, usage data is collected as it becomes available, in process 1116. The usage data is then leveraged to update the usage patterns, at 1118. The new, updated and/or refined usage patterns may then direct the generation of an updated powering schedule. In this manner, the schedule will continually be improved to reflect the actual behaviors of the devices within the environment.

For example, assume the scenario described above if for a married couple, and while the phone usage is accurate for one partner, the other partner individual works away from the home. During the work hours this person's cell phone is being used heavily, but is outside of the coverage region. Thus, the usage model may update to indicate that the phone is removed from the coverage region at say 6:30 A.M. and returns at 4:30 P.M. in the afternoon significantly depleted. Consequently, the system adjusts the schedule to reflect that the phone requires significant charging between the hours of 4:30 P.M. and 6:30 A.M. the following morning. The other phone, however, may be serviced according to the prototypical schedule.

In another example of operation, assume that the tablet remains within the coverage area of the home but that it is often docked for providing music. The dock is a wired power source and, as such, the tablet's relative usage is reduced significantly providing the charger additional capacity for the other devices within the coverage region. The couple enjoys playing games. As such, rather than the stereotypical heavy weekend usage, the game controllers instead are used in the evening throughout the week. As this usage data is compiled by the charger, the schedule may be altered dramatically in order to properly service the various devices. At night, for example, the phone that remains at home may be serviced heavily, whereas the controllers may receive additional attention during the mid-day. Upon return, the second cell phone may be provided almost exclusive power delivery, until much later in the evening when the charge is brought back to an acceptable level. As the tablet is often wired, there isn't much need to deliver power to this device unless it deviates from established patterns of use.

In addition to being able to establish usage patterns, use based powering is also able to quickly identify when a device's usage deviates from established patterns. For example, if a phone is forgotten on a given day and remains charging, then in the evening there will not be the expected load of a heavily depleted device to service and, as such, other devices may be serviced to a higher threshold than would typically be delivered in anticipation of the extra power capacity later in the day.

Similarly, the system may identify that on the weekends there is a high likelihood that additional unknown devices will be present in the coverage region. These devices may correspond to visitors on the weekend that being their phones and other devices. By being aware of this potential for unpredictable power requirements during the weekends, the system may compensate accordingly in preparation for more flexibility in the schedule on these days.

The determination of usage predictions may employ a wide variety of predictive algorithms, including Bayesian networks, decision tree learning, artificial neural networks, cluster analysis, moving average, moving median and the like.

C. Example Usage Pattern Generation

For embodiments of power delivery scheduling where device usage information is utilized, various means of collecting and analyzing the usage data may be employed. In some embodiments, some of the usage data may be ignored in order to ensure that the usage models for the device are not polluted with abnormal or detrimental data.

Figure 12:
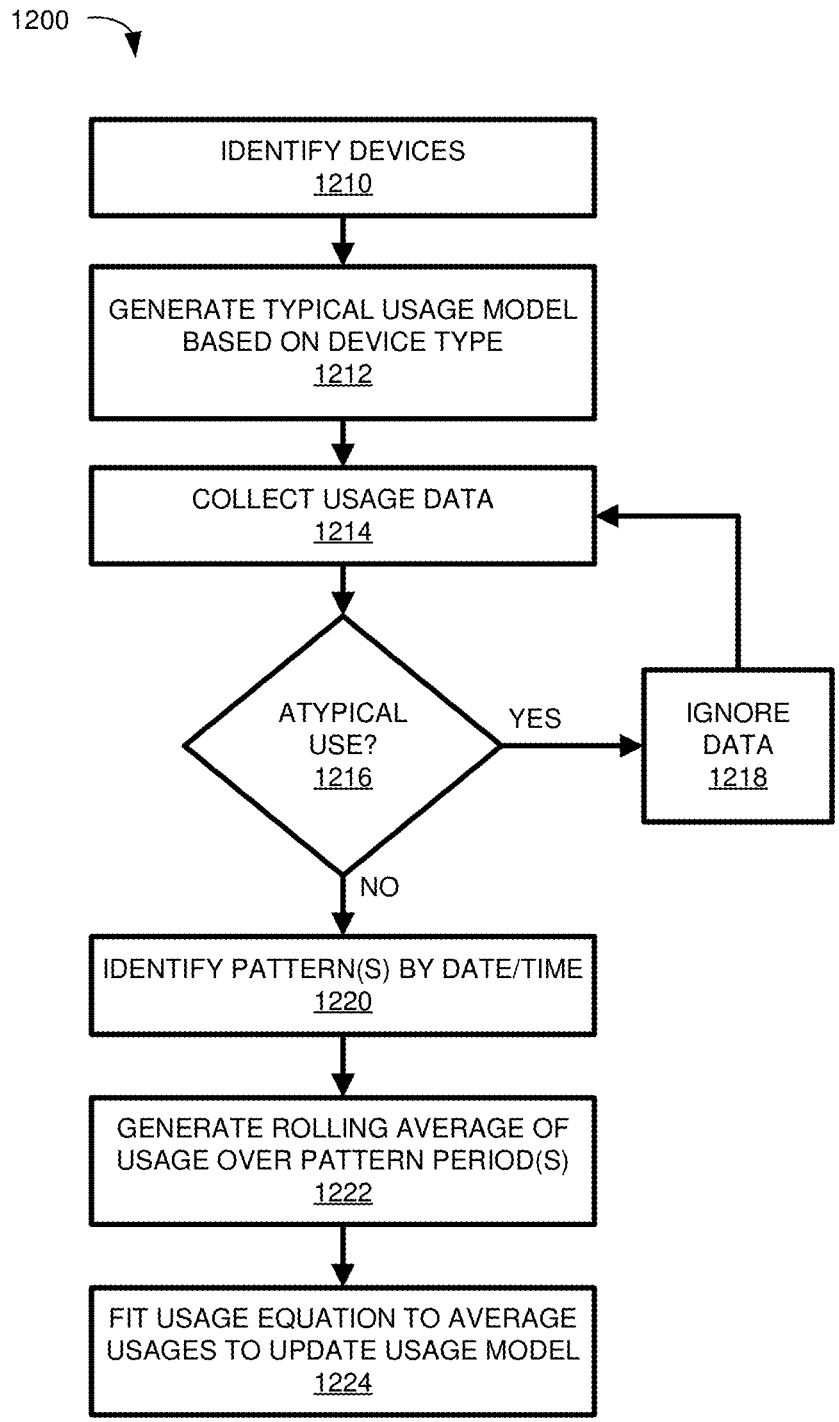
FIG. 12 provides a flow diagram for an example process of generating usage data for informing power delivery scheduling in accordance with some embodiments.

FIG. 12 provides a flow diagram for an example process 1200 of generating usage data for informing power delivery scheduling, according to some embodiments. A wireless power transmission system such as, for example, wireless power transmission system 601 of FIG. 6 or wireless power transmission system 101 of FIG. 1 can, among other functions, perform example process 1100. Alternatively, or additionally, process 1200 can be performed, in whole or in part, by a cloud based system in communication with the wireless power transmission system.

Initially, the charger and/or cloud processing systems identify the devices within a given charging environment, and impute in a 'typical' usage model of the devices based upon the type, at 1210. As previously discussed, some devices have very predictable usage patterns by the nature of what kind of device they are. Other devices have more variable usage patterns based upon the user. However, even these more variable devices may have some common usage patterns that may be used, at least initially, for modeling. For example, a thermostat clearly will have relatively low power requirements and be rather constant usage for most users. In contrast, a cell phone may have a highly variable usage pattern that is entirely user specific. However, as previously mentioned, it is likely that even very different users will typically have low usage of their phones between two and four in the morning, for example.

One advantage of the present system, however, is that this initial usage model may be rapidly enhanced as soon as the devices are utilized. The usage data is first collected, at 1214, and filtered according to the relevance of the data, at 1216. For example, if a user uses a game console controller every evening for an hour, and on a particular day the user uses the controller for three hours, this extended usage may be flagged as atypical (or an anomaly or an outlier) use and subsequently ignored, at 1218. Many known means may be employed to determine if a particular piece of data is statistically relevant to a data set such as k-means, and may be employed in order to make the determination if the newly collected data should be excluded from the model, or incorporated into the usage pattern.

Patterns of usage may be identified by date, time of day, weekday, month, season, year, etc. in some embodiments, at 1220. A rolling average of usage over the pattern period is generated, at 1222, and a usage function may be fit to the average usage numbers, at 1224. As more usage data becomes available, the rolling average updates accordingly. Likewise, the usage function fit to this data may likewise be updated, and in this manner the usage model is continually improved as added data becomes available.

Fitting of the usage function to the rolling average may include a linear regression, moving average or moving median, figure of merit function, or any other known means for fitting an equation to a set of data points. FIGS. 13A-D illustrates one simplified example of this process to clarify the generation of a usage modeling function.

The following figures relate to the usage of a wirelessly powered device over the course of a number of days. For this example, assume the device is a cell phone or similar device. The power usage of the device, on a per hour basis, is provided in the below table 1.

TABLE 1

Example Power Usage

| Day-Hour | Received by Device (mW) | Device Capacity (%) | Device Capacity Without Wireless Charging (%) | Device Usage Level | State | Charge (mW) Need to Keep @ 100% |
| --- | --- | --- | --- | --- | --- | --- |
| Monday-1 | 0 | 100 | 100 | 2 | Wired | 0 |
| Monday-2 | 0 | 100 | 100 | 2 | Wired | 0 |
| Monday-3 | 0 | 100 | 100 | 2 | Wired | 0 |

TABLE 1-continued

Example Power Usage

| Day-Hour | Received by Device (mW) | Device Capacity (%) | Device Capacity Without Wireless Charging (%) | Device Usage Level | State | Charge (mW) Need to Keep @ 100% |
|---|---|---|---|---|---|---|
| Monday-4 | 0 | 100 | 100 | 2 | Wired | 0 |
| Monday-5 | 0 | 100 | 100 | 2 | Wired | 0 |
| Monday-6 | 0 | 100 | 100 | 2 | Wired | 0 |
| Monday-7 | 60 | 95 | 93 | 7 | Wireless | 210 |
| Monday-8 | 60 | 90 | 86 | 7 | Wireless | 420 |
| Monday-9 | 60 | 88 | 82 | 4 | Wireless | 540 |
| Monday-10 | 60 | 86 | 78 | 4 | Wireless | 660 |
| Monday-11 | 60 | 84 | 74 | 4 | Wireless | 780 |
| Monday-12 | 60 | 78 | 66 | 8 | Wireless | 1020 |
| Monday-13 | 60 | 72 | 58 | 8 | Wireless | 1260 |
| Monday-14 | 60 | 70 | 54 | 4 | Wireless | 1380 |
| Monday-15 | 60 | 68 | 50 | 4 | Wireless | 1500 |
| Monday-16 | 60 | 66 | 46 | 4 | Wireless | 1620 |
| Monday-17 | 60 | 64 | 42 | 4 | Wireless | 1740 |
| Monday-18 | 60 | 62 | 38 | 4 | Wireless | 1860 |
| Monday-19 | 60 | 61 | 35 | 3 | Wireless | 1950 |
| Monday-20 | 60 | 58 | 30 | 5 | Wireless | 2100 |
| Monday-21 | 60 | 55 | 25 | 5 | Wireless | 2250 |
| Monday-22 | 60 | 55 | 23 | 2 | Wireless | 2310 |
| Monday-23 | 60 | 55 | 21 | 2 | Wireless | 2370 |
| Monday-24 | 60 | 55 | 19 | 2 | Wireless | 2430 |
| Tuesday-1 | 0 | 100 | 100 | 2 | Wired | 0 |
| Tuesday-2 | 0 | 100 | 100 | 2 | Wired | 0 |
| Tuesday-3 | 0 | 100 | 100 | 2 | Wired | 0 |
| Tuesday-4 | 0 | 100 | 100 | 2 | Wired | 0 |
| Tuesday-5 | 0 | 100 | 100 | 2 | Wired | 0 |
| Tuesday-6 | 0 | 100 | 100 | 2 | Wired | 0 |
| Tuesday-7 | 60 | 96 | 94 | 6 | Wireless | 180 |
| Tuesday-8 | 60 | 92 | 88 | 6 | Wireless | 360 |
| Tuesday-9 | 60 | 90 | 84 | 4 | Wireless | 480 |
| Tuesday-10 | 60 | 88 | 80 | 4 | Wireless | 600 |
| Tuesday-11 | 60 | 86 | 76 | 4 | Wireless | 720 |
| Tuesday-12 | 60 | 78 | 66 | 10 | Wireless | 1020 |
| Tuesday-13 | 60 | 70 | 56 | 10 | Wireless | 1320 |
| Tuesday-14 | 60 | 68 | 52 | 4 | Wireless | 1440 |
| Tuesday-15 | 60 | 66 | 48 | 4 | Wireless | 1560 |
| Tuesday-16 | 60 | 64 | 44 | 4 | Wireless | 1680 |
| Tuesday-17 | 60 | 62 | 40 | 4 | Wireless | 1800 |
| Tuesday-18 | 60 | 60 | 36 | 4 | Wireless | 1920 |
| Tuesday-19 | 60 | 59 | 33 | 3 | Wireless | 2010 |
| Tuesday-20 | 60 | 55 | 27 | 6 | Wireless | 2190 |
| Tuesday-21 | 60 | 52 | 22 | 5 | Wireless | 2340 |
| Tuesday-22 | 60 | 52 | 20 | 2 | Wireless | 2400 |
| Tuesday-23 | 60 | 52 | 18 | 2 | Wireless | 2460 |
| Tuesday-24 | 60 | 53 | 17 | 1 | Wireless | 2490 |
| Wednesday-1 | 0 | 100 | 100 | 2 | Wired | 0 |
| Wednesday-2 | 0 | 100 | 100 | 2 | Wired | 0 |
| Wednesday-3 | 0 | 100 | 100 | 2 | Wired | 0 |
| Wednesday-4 | 0 | 100 | 100 | 2 | Wired | 0 |
| Wednesday-5 | 0 | 100 | 100 | 2 | Wired | 0 |
| Wednesday-6 | 0 | 100 | 100 | 2 | Wired | 0 |
| Wednesday-7 | 60 | 95 | 93 | 7 | Wireless | 210 |
| Wednesday-8 | 60 | 90 | 86 | 7 | Wireless | 420 |
| Wednesday-9 | 60 | 88 | 82 | 4 | Wireless | 540 |
| Wednesday-10 | 60 | 86 | 78 | 4 | Wireless | 660 |
| Wednesday-11 | 60 | 84 | 74 | 4 | Wireless | 780 |
| Wednesday-12 | 60 | 78 | 66 | 8 | Wireless | 1020 |
| Wednesday-13 | 60 | 72 | 58 | 8 | Wireless | 1260 |
| Wednesday-14 | 60 | 70 | 54 | 4 | Wireless | 1380 |
| Wednesday-15 | 60 | 68 | 50 | 4 | Wireless | 1500 |
| Wednesday-16 | 60 | 66 | 46 | 4 | Wireless | 1620 |
| Wednesday-17 | 60 | 64 | 42 | 4 | Wireless | 1740 |
| Wednesday-18 | 60 | 62 | 38 | 4 | Wireless | 1860 |
| Wednesday-19 | 60 | 61 | 35 | 3 | Wireless | 1950 |
| Wednesday-20 | 60 | 58 | 30 | 5 | Wireless | 2100 |
| Wednesday-21 | 60 | 55 | 25 | 5 | Wireless | 2250 |
| Wednesday-22 | 60 | 55 | 23 | 2 | Wireless | 2310 |
| Wednesday-23 | 60 | 55 | 21 | 2 | Wireless | 2370 |
| Wednesday-24 | 60 | 55 | 19 | 2 | Wireless | 2430 |

In this example, while wirelessly charging the device is capable of receiving 60 milliwatts of power in an hour (a milliwatt per minute). For this example, the charge received by the device is consistent when receiving power wirelessly. In reality, the power delivered to the device may vary considerably over time as there are changes within the charging environment. However, for the sake of clarity, in this example the charge delivered shall be a constant value for a given period of charging.

The percentage of actual battery charge is provided in the third column. For comparison purposes, in the fourth column is the percentage of device capacity that would exist if there were no wireless charging available to the device. For this example, every percentage of device power capacity may correspond to approximately 30 mw of power. It is realized that the relationship between percentage of battery capacity is not linear to wattage expended, but rather is a function of amps expended per a given time period; however, for the sake of clarity of the example, for this table this relationship is simplified.

The fifth column in the above example table is an indication of relative power utilization on a scale of 1-10. A usage of two, in this example, may indicate the device is idle, and consuming relatively little power. In contrast, a usage of 10, in the above example, may indicate the device is engaged in GPS transmission or other energy intensive activity. Within this example table, every point of usage corresponds to 30 milliwatts of power. Thus, for this example, the relative power intensity expended per hour has a direct reduction of percentage battery capacity.

The sixth column in the above example table indicates if the device is receiving power via a wired power source, or wirelessly. Note that, in this example, the user plugs in the phone between midnight and six in the morning. During this time the power utilization is also low, indicating that the device isn't being used during this time. However, once the user is up, the phone relies upon wireless charging and residual battery capacity. Usage during the day is somewhat prototypical: heavy phone usage in the morning and over the lunch hour, and moderate usage in the evenings.

The final column in the above example table indicates the total power that needs to be delivered over the course of the day to keep the battery level at 100 percent. This value varies from day to day based upon utilization levels, however this data may be utilized by the system to determine there is a daily pattern present. Thus, a rolling average for power needed over the course of each day may be generated.

Figure 13A:
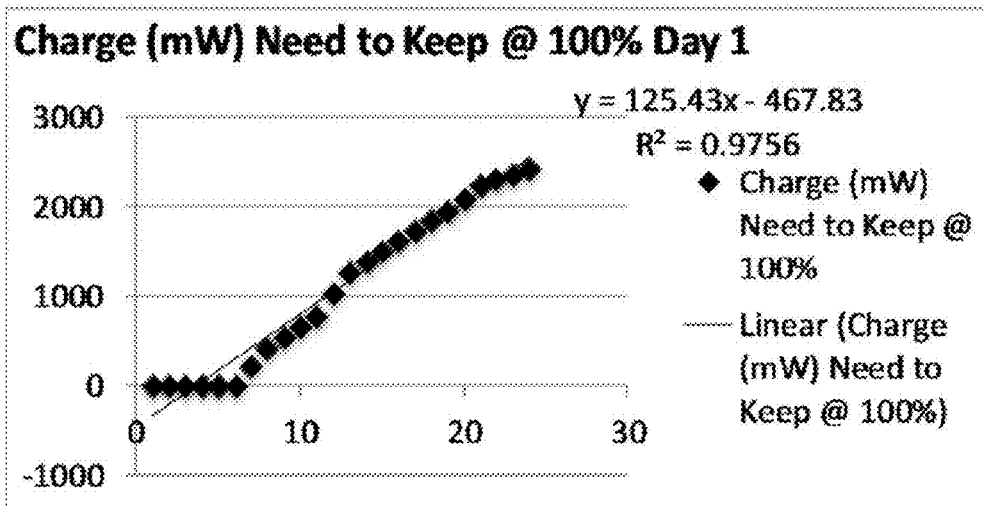
FIGS. 13A-D are graphs generated from the data presented in the example table 1 provided.

FIGS. 13A-D are graphs generated from the data present in the example table 1 provided above. In particular, FIG. 13A illustrates the charge required to keep the phone's battery at 100 percent for the first day. Additionally, a linear regression is used to fit a line to the curve. The $R_2$ value is also calculated in order to show how closely the line fits the empirically derived data. For the first day the slope of the line is 125.43, with a y-intercept of −467.83 (due to the wired charging in the early morning).

Figure 13B:
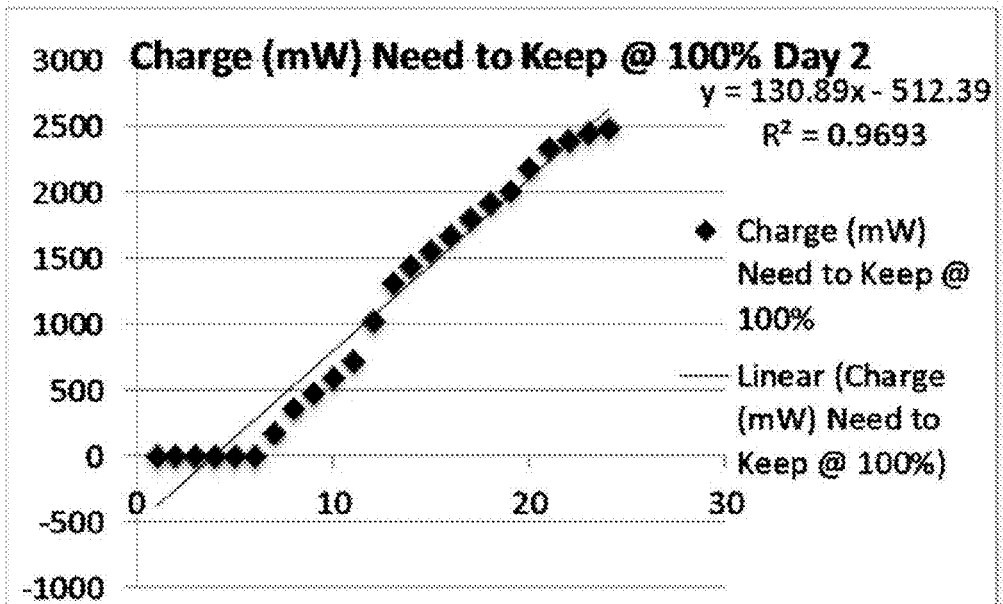
Figure 13C:
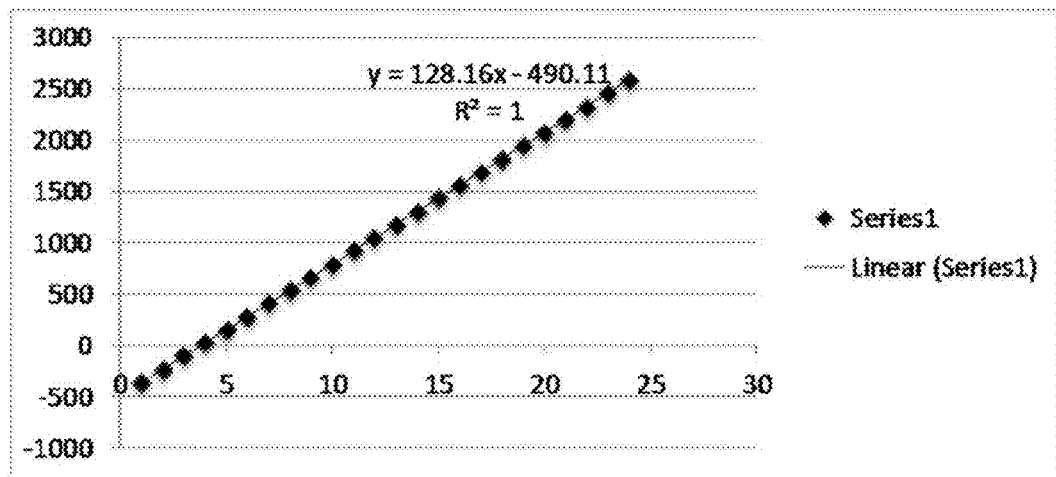

FIG. 13B is a similar graph of charge required to keep the phone's battery at 100 percent for the second day. Due to the different utilization rates, the slope of the fitted line for this second day is 130.89, with a y-intercept of −512.39. Since the system recognizes that the pattern for usage, for this device, is based upon a 24-hour cycle, the results from the first and second day may be averaged in order to generate a usage prediction. FIG. 13C illustrates this average for these first two days. The average slope over the two-day period is 128.16, with a y-intercept of −490.11.

Figure 13D:
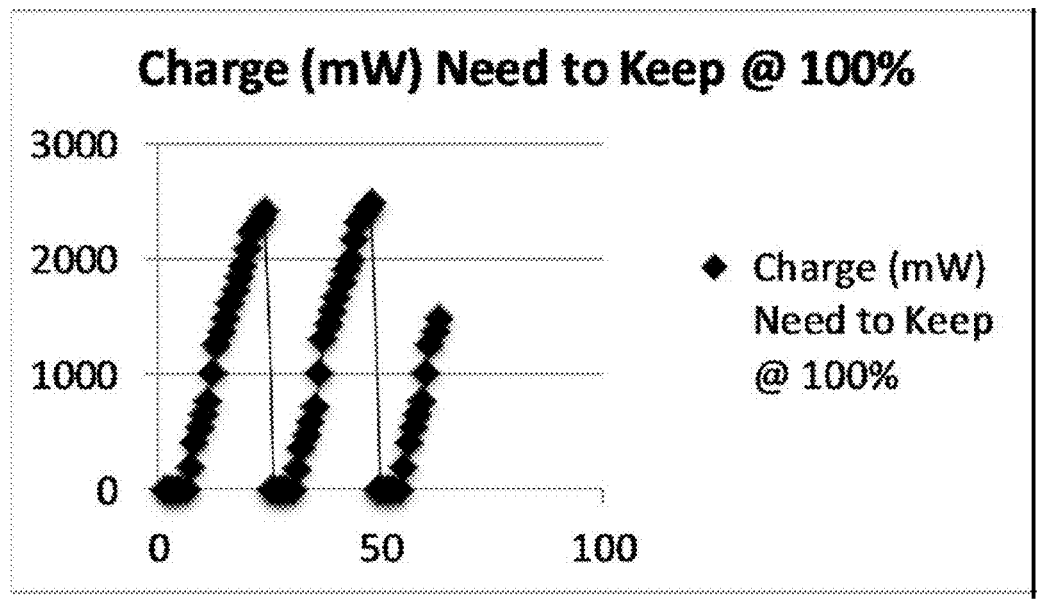

Lastly, FIG. 13D illustrates the charge required to maintain a battery at 100 percent over the three-day period along with the rolling average of the usage model. The usage equation, in this example is linear, and repeats on a 24-hour cycle, however, one can easily imagine that other functions may be employed (parabolic, cyclic, etc.) based upon usage patterns. Likewise, while a daily pattern is present in this example, more elaborate patterns may also exist. For example, a robotic vacuum (such as a Roomba) may be built to include wireless charging. This device may have a daily usage pattern, e.g., operates between 2-4 P.M. each afternoon. However, there may be additional patterns that are taken into effect. For example, during the summer there may be more outside traffic bringing dirt into the building. Thus, during May through August, for example, the duty cycle may extend from 2-5 P.M. most days to compensate for the additional dirt that must be cleaned. The usage model for the device may thus be dynamic enough to account for these multiple patterns of use.

The example figures and tables have been simplified to clarify the generation of usage predictions. The usage predictions may include more detailed and complex dimensions to the usage predictions. For example, a cell phone usage (and associated power consumption) may vary significantly by the kind of activity being performed. For example, GPS usage is a significant drain on energy levels compared with a standby mode. Internet usage likewise is more energy intensive then talking. Table 2, below, provides a more accurate energy usage numbers for various example iPhone devices:

TABLE 2

| | Example battery life by device and activity | | | | | |
|---|---|---|---|---|---|---|
| | iPhone 6 Plus | iPhone 6 | iPhone 5s | iPhone 5c | iPhone 4 | iPhone 4s |
| Talk Time 3G (Hours) | 24 | 14 | 10 | 10 | 7 | 8 |
| Standby Time (Hours) | 384 | 250 | 250 | 250 | 300 | 200 |
| Internet Use 3G (Hours) | 12 | 10 | 8 | 8 | 6 | 6 |
| Internet Use LTE (Hours) | 12 | 10 | 10 | 10 | | |
| Internet Use Wi-Fi (Hours) | 12 | 11 | 10 | 10 | 10 | 9 |
| Video Playback (Hours) | 14 | 11 | 10 | 10 | 10 | 10 |
| Audio Playback (Hours) | 80 | 50 | 40 | 40 | 40 | 40 |

Given these measured energy consumption levels by device, a series of possible usage cases may be modeled to illustrate the granularity of the usage prediction modeling. In these example usage models the device is tracked on a minute by minute basis over the course of a single hour. Tables 3-5 provide example usage for an iPhone 6 plus, iPhone 6 and iPhone 5s, respectively.

TABLE 3

| | | | | Example iPhone 6 plus usage model | | | | |
|---|---|---|---|---|---|---|---|---|
| State | Min | Disch (mW) | Disch (J) | Capacity (J) | iPhone 6 Plus Capacity % (No Charging) | Charge (mW) | Charge (J) | Capacity (J) | iPhone 6 Plus Capacity % (Charging) |
| Standby | 1 | 29 | 1.73 | 39958.27 | 100 | 0 | 0 | 39958.27 | 100 |
| Standby | 2 | 29 | 1.73 | 39956.53 | 99.99 | 29 | 1.74 | 39958.27 | 100 |
| Standby | 3 | 29 | 1.73 | 39954.8 | 99.99 | 29 | 1.74 | 39958.28 | 100 |
| Standby | 4 | 29 | 1.73 | 39953.06 | 99.98 | 29 | 1.74 | 39958.28 | 100 |
| Standby | 5 | 29 | 1.73 | 39951.33 | 99.98 | 29 | 1.74 | 39958.29 | 100 |
| Standby | 6 | 29 | 1.73 | 39949.59 | 99.97 | 29 | 1.74 | 39958.29 | 100 |
| Standby | 7 | 29 | 1.73 | 39947.86 | 99.97 | 29 | 1.74 | 39958.3 | 100 |
| Standby | 8 | 29 | 1.73 | 39946.13 | 99.97 | 29 | 1.74 | 39958.31 | 100 |
| Standby | 9 | 29 | 1.73 | 39944.39 | 99.96 | 29 | 1.74 | 39958.31 | 100 |
| Standby | 10 | 29 | 1.73 | 39942.66 | 99.96 | 29 | 1.74 | 39958.32 | 100 |
| Internet | 11 | 925 | 55.5 | 39887.16 | 99.82 | 522 | 31.32 | 39934.14 | 99.94 |
| Internet | 12 | 925 | 55.5 | 39831.66 | 99.68 | 522 | 31.32 | 39909.96 | 99.87 |
| Internet | 13 | 925 | 55.5 | 39776.16 | 99.54 | 522 | 31.32 | 39885.78 | 99.81 |
| Internet | 14 | 925 | 55.5 | 39720.66 | 99.4 | 522 | 31.32 | 39861.6 | 99.75 |
| Internet | 15 | 925 | 55.5 | 39665.16 | 99.26 | 522 | 31.32 | 39837.42 | 99.69 |
| Internet | 16 | 925 | 55.5 | 39609.66 | 99.12 | 522 | 31.32 | 39813.24 | 99.63 |
| Internet | 17 | 925 | 55.5 | 39554.16 | 98.98 | 522 | 31.32 | 39789.06 | 99.57 |
| Internet | 18 | 925 | 55.5 | 39498.66 | 98.85 | 522 | 31.32 | 39764.88 | 99.51 |
| Internet | 19 | 925 | 55.5 | 39443.16 | 98.71 | 522 | 31.32 | 39740.7 | 99.45 |
| Internet | 20 | 925 | 55.5 | 39387.66 | 98.57 | 522 | 31.32 | 39716.52 | 99.39 |
| Internet | 21 | 925 | 55.5 | 39332.16 | 98.43 | 333 | 19.9998 | 39681.02 | 99.3 |
| Internet | 22 | 925 | 55.5 | 39276.66 | 98.29 | 333 | 19.9998 | 39645.52 | 99.21 |
| Internet | 23 | 925 | 55.5 | 39221.16 | 98.15 | 333 | 19.9998 | 39610.02 | 99.12 |
| Internet | 24 | 925 | 55.5 | 39165.66 | 98.01 | 333 | 19.9998 | 39574.52 | 99.04 |
| Internet | 25 | 925 | 55.5 | 39110.16 | 97.87 | 333 | 19.9998 | 39539.02 | 98.95 |
| Internet | 26 | 925 | 55.5 | 39054.66 | 97.73 | 333 | 19.9998 | 39503.52 | 98.86 |
| Internet | 27 | 925 | 55.5 | 38999.16 | 97.6 | 333 | 19.9998 | 39468.01 | 98.77 |
| Internet | 28 | 925 | 55.5 | 38943.66 | 97.46 | 333 | 19.9998 | 39432.51 | 98.68 |
| Internet | 29 | 925 | 55.5 | 38888.16 | 97.32 | 333 | 19.9998 | 39397.01 | 98.59 |
| Internet | 30 | 925 | 55.5 | 38832.66 | 97.18 | 333 | 19.9998 | 39361.51 | 98.5 |
| TalkTime | 31 | 463 | 27.75 | 38804.91 | 97.11 | 333 | 19.9998 | 39353.76 | 98.48 |
| TalkTime | 32 | 463 | 27.75 | 38777.16 | 97.04 | 333 | 19.9998 | 39346.01 | 98.46 |
| TalkTime | 33 | 463 | 27.75 | 38749.41 | 96.97 | 333 | 19.9998 | 39338.26 | 98.44 |
| TalkTime | 34 | 463 | 27.75 | 38721.66 | 96.9 | 333 | 19.9998 | 39330.51 | 98.42 |
| TalkTime | 35 | 463 | 27.75 | 38693.91 | 96.83 | 333 | 19.9998 | 39322.76 | 98.41 |
| TalkTime | 36 | 463 | 27.75 | 38666.16 | 96.76 | 419 | 25.14 | 39320.15 | 98.4 |
| TalkTime | 37 | 463 | 27.75 | 38638.41 | 96.69 | 419 | 25.14 | 39317.54 | 98.39 |
| TalkTime | 38 | 463 | 27.75 | 38610.66 | 96.62 | 419 | 25.14 | 39314.93 | 98.39 |
| TalkTime | 39 | 463 | 27.75 | 38582.91 | 96.55 | 419 | 25.14 | 39312.32 | 98.38 |
| TalkTime | 40 | 463 | 27.75 | 38555.16 | 96.48 | 419 | 25.14 | 39309.71 | 98.37 |
| Video | 41 | 793 | 47.57 | 38507.58 | 96.37 | 426 | 25.56 | 39287.7 | 98.32 |
| Video | 42 | 793 | 47.57 | 38460.01 | 96.25 | 426 | 25.56 | 39265.69 | 98.26 |
| Video | 43 | 793 | 47.57 | 38412.44 | 96.13 | 426 | 25.56 | 39243.68 | 98.21 |
| Video | 44 | 793 | 47.57 | 38364.87 | 96.01 | 426 | 25.56 | 39221.67 | 98.15 |
| Video | 45 | 793 | 47.57 | 38317.3 | 95.89 | 426 | 25.56 | 39199.66 | 98.1 |
| Talktime | 46 | 463 | 27.75 | 38289.55 | 95.82 | 714 | 42.84 | 39214.75 | 98.14 |
| Talktime | 47 | 463 | 27.75 | 38261.8 | 95.75 | 714 | 42.84 | 39229.84 | 98.17 |
| Talktime | 48 | 463 | 27.75 | 38234.05 | 95.68 | 714 | 42.84 | 39244.93 | 98.21 |
| Talktime | 49 | 463 | 27.75 | 38206.3 | 95.61 | 714 | 42.84 | 39260.02 | 98.25 |
| Talktime | 50 | 463 | 27.75 | 38178.55 | 95.54 | 714 | 42.84 | 39275.11 | 98.29 |
| Talktime | 51 | 463 | 27.75 | 38150.8 | 95.47 | 400 | 24 | 39271.36 | 98.28 |
| Talktime | 52 | 463 | 27.75 | 38123.05 | 95.4 | 400 | 24 | 39267.61 | 98.27 |
| Talktime | 53 | 463 | 27.75 | 38095.3 | 95.33 | 400 | 24 | 39263.86 | 98.26 |
| Talktime | 54 | 463 | 27.75 | 38067.55 | 95.26 | 400 | 24 | 39260.11 | 98.25 |
| Talktime | 55 | 463 | 27.75 | 38039.8 | 95.19 | 400 | 24 | 39256.36 | 98.24 |
| Audio | 56 | 139 | 8.33 | 38031.47 | 95.17 | 400 | 24 | 39272.03 | 98.28 |
| Audio | 57 | 139 | 8.33 | 38023.15 | 95.15 | 400 | 24 | 39287.71 | 98.32 |
| Audio | 58 | 139 | 8.33 | 38014.82 | 95.13 | 400 | 24 | 39303.38 | 98.36 |
| Audio | 59 | 139 | 8.33 | 38006.5 | 95.11 | 400 | 24 | 39319.06 | 98.4 |
| Audio | 60 | 139 | 8.33 | 37998.17 | 95.09 | 400 | 24 | 39334.73 | 98.44 |

TABLE 4

Example iPhone 6 usage model

| State | Min | Disch (mW) | Disch (J) | Capacity (J) | iPhone 6 Plus Capacity % (No Charging) | Charge (mW) | Charge (J) | Capacity (J) | iPhone 6 Plus Capacity % (Charging) |
|---|---|---|---|---|---|---|---|---|---|
| TalkTime | 1 | 494 | 29.61 | 24846.39 | 99.88 | 0 | 0 | 24846.39 | 99.88 |
| TalkTime | 2 | 494 | 29.61 | 24816.77 | 99.76 | 471 | 28.26 | 24845.03 | 99.88 |
| TalkTime | 3 | 494 | 29.61 | 24787.16 | 99.64 | 471 | 28.26 | 24843.68 | 99.87 |
| TalkTime | 4 | 494 | 29.61 | 24757.54 | 99.52 | 471 | 28.26 | 24842.32 | 99.86 |
| TalkTime | 5 | 494 | 29.61 | 24727.93 | 99.4 | 471 | 28.26 | 24840.97 | 99.86 |
| TalkTime | 6 | 494 | 29.61 | 24698.31 | 99.29 | 471 | 28.26 | 24839.61 | 99.85 |
| TalkTime | 7 | 494 | 29.61 | 24668.7 | 99.17 | 471 | 28.26 | 24838.26 | 99.85 |
| TalkTime | 8 | 494 | 29.61 | 24639.09 | 99.05 | 471 | 28.26 | 24836.91 | 99.84 |
| TalkTime | 9 | 494 | 29.61 | 24609.47 | 98.93 | 471 | 28.26 | 24835.55 | 99.84 |
| TalkTime | 10 | 494 | 29.61 | 24579.86 | 98.81 | 471 | 28.26 | 24834.2 | 99.83 |
| Standby | 11 | 28 | 1.66 | 24578.2 | 98.8 | 28 | 1.68 | 24834.22 | 99.83 |
| Standby | 12 | 28 | 1.66 | 24576.54 | 98.8 | 28 | 1.68 | 24834.24 | 99.83 |
| Standby | 13 | 28 | 1.66 | 24574.88 | 98.79 | 28 | 1.68 | 24834.26 | 99.83 |
| Standby | 14 | 28 | 1.66 | 24573.22 | 98.78 | 28 | 1.68 | 24834.28 | 99.83 |
| Standby | 15 | 28 | 1.66 | 24571.57 | 98.78 | 28 | 1.68 | 24834.31 | 99.83 |
| Standby | 16 | 28 | 1.66 | 24569.91 | 98.77 | 28 | 1.68 | 24834.33 | 99.83 |
| Standby | 17 | 28 | 1.66 | 24568.25 | 98.76 | 28 | 1.68 | 24834.35 | 99.83 |
| Standby | 18 | 28 | 1.66 | 24566.59 | 98.76 | 28 | 1.68 | 24834.37 | 99.83 |
| Standby | 19 | 28 | 1.66 | 24564.93 | 98.75 | 28 | 1.68 | 24834.39 | 99.83 |
| Standby | 20 | 28 | 1.66 | 24563.27 | 98.74 | 28 | 1.68 | 24834.41 | 99.83 |
| InternetLTE | 21 | 691 | 41.46 | 24521.81 | 98.58 | 333 | 19.9998 | 24812.95 | 99.75 |
| InternetLTE | 22 | 691 | 41.46 | 24480.35 | 98.41 | 333 | 19.9998 | 24791.49 | 99.66 |
| InternetLTE | 23 | 691 | 41.46 | 24438.89 | 98.24 | 333 | 19.9998 | 24770.03 | 99.57 |
| InternetLTE | 24 | 691 | 41.46 | 24397.43 | 98.08 | 333 | 19.9998 | 24748.57 | 99.49 |
| InternetLTE | 25 | 691 | 41.46 | 24355.97 | 97.91 | 333 | 19.9998 | 24727.11 | 99.4 |
| InternetLTE | 26 | 691 | 41.46 | 24314.51 | 97.74 | 333 | 19.9998 | 24705.65 | 99.32 |
| InternetLTE | 27 | 691 | 41.46 | 24273.05 | 97.58 | 333 | 19.9998 | 24684.19 | 99.23 |
| InternetLTE | 28 | 691 | 41.46 | 24231.59 | 97.41 | 333 | 19.9998 | 24662.73 | 99.14 |
| InternetLTE | 29 | 691 | 41.46 | 24190.13 | 97.24 | 333 | 19.9998 | 24641.27 | 99.06 |
| InternetLTE | 30 | 691 | 41.46 | 24148.67 | 97.08 | 333 | 19.9998 | 24619.81 | 98.97 |
| TalkTime | 31 | 494 | 29.61 | 24119.06 | 96.96 | 333 | 19.9998 | 24610.2 | 98.93 |
| TalkTime | 32 | 494 | 29.61 | 24089.44 | 96.84 | 333 | 19.9998 | 24600.58 | 98.89 |
| TalkTime | 33 | 494 | 29.61 | 24059.83 | 96.72 | 333 | 19.9998 | 24590.97 | 98.85 |
| TalkTime | 34 | 494 | 29.61 | 24030.22 | 96.6 | 333 | 19.9998 | 24581.35 | 98.82 |
| TalkTime | 35 | 494 | 29.61 | 24000.6 | 96.48 | 333 | 19.9998 | 24571.74 | 98.78 |
| Video | 36 | 628 | 37.69 | 23962.91 | 96.33 | 433 | 25.9998 | 24560.05 | 98.73 |
| Video | 37 | 628 | 37.69 | 23925.22 | 96.18 | 433 | 25.9998 | 24548.36 | 98.68 |
| Video | 38 | 628 | 37.69 | 23887.53 | 96.03 | 433 | 25.9998 | 24536.67 | 98.64 |
| Video | 39 | 628 | 37.69 | 23849.84 | 95.87 | 433 | 25.9998 | 24524.97 | 98.59 |
| Video | 40 | 628 | 37.69 | 23812.15 | 95.72 | 433 | 25.9998 | 24513.28 | 98.54 |
| Video | 41 | 628 | 37.69 | 23774.46 | 95.57 | 426 | 25.56 | 24501.15 | 98.49 |
| Video | 42 | 628 | 37.69 | 23736.77 | 95.42 | 426 | 25.56 | 24489.02 | 98.44 |
| Video | 43 | 628 | 37.69 | 23699.07 | 95.27 | 426 | 25.56 | 24476.89 | 98.4 |
| Video | 44 | 628 | 37.69 | 23661.38 | 95.12 | 426 | 25.56 | 24464.76 | 98.35 |
| Video | 45 | 628 | 37.69 | 23623.69 | 94.97 | 426 | 25.56 | 24452.63 | 98.3 |
| Audio | 46 | 138 | 8.29 | 23615.4 | 94.93 | 138 | 8.28 | 24452.62 | 98.3 |
| Audio | 47 | 138 | 8.29 | 23607.11 | 94.9 | 138 | 8.28 | 24452.6 | 98.3 |
| Audio | 48 | 138 | 8.29 | 23598.82 | 94.87 | 138 | 8.28 | 24452.59 | 98.3 |
| Audio | 49 | 138 | 8.29 | 23590.52 | 94.83 | 138 | 8.28 | 24452.58 | 98.3 |
| Audio | 50 | 138 | 8.29 | 23582.23 | 94.8 | 138 | 8.28 | 24452.57 | 98.3 |
| Talktime | 51 | 494 | 29.61 | 23552.62 | 94.68 | 400 | 24 | 24446.95 | 98.28 |
| Talktime | 52 | 494 | 29.61 | 23523 | 94.56 | 400 | 24 | 24441.34 | 98.25 |
| Talktime | 53 | 494 | 29.61 | 23493.39 | 94.44 | 400 | 24 | 24435.73 | 98.23 |
| Talktime | 54 | 494 | 29.61 | 23463.78 | 94.32 | 400 | 24 | 24430.11 | 98.21 |
| Talktime | 55 | 494 | 29.61 | 23434.16 | 94.2 | 400 | 24 | 24424.5 | 98.18 |
| Talktime | 56 | 494 | 29.61 | 23404.55 | 94.08 | 400 | 24 | 24418.88 | 98.16 |
| Talktime | 57 | 494 | 29.61 | 23374.93 | 93.97 | 400 | 24 | 24413.27 | 98.14 |
| Talktime | 58 | 494 | 29.61 | 23345.32 | 93.85 | 400 | 24 | 24407.65 | 98.12 |
| Talktime | 59 | 494 | 29.61 | 23315.7 | 93.73 | 400 | 24 | 24402.04 | 98.09 |
| Talktime | 60 | 494 | 29.61 | 23286.09 | 93.61 | 400 | 24 | 24396.43 | 98.07 |

TABLE 5

Example iPhone 5s usage model

| State | Min | Disch (mW) | Disch (J) | Capacity (J) | iPhone 6 Plus Capacity % (No Charging) | Charge (mW) | Charge (J) | Capacity (J) | iPhone 6 Plus Capacity % (Charging) |
|---|---|---|---|---|---|---|---|---|---|
| InternetLTE | 1 | 592 | 35.52 | 21276.48 | 99.83 | 0 | 0 | 21276.48 | 99.83 |
| InternetLTE | 2 | 592 | 35.52 | 21240.96 | 99.67 | 500 | 30 | 21270.96 | 99.81 |
| InternetLTE | 3 | 592 | 35.52 | 21205.44 | 99.5 | 500 | 30 | 21265.44 | 99.78 |
| InternetLTE | 4 | 592 | 35.52 | 21169.92 | 99.33 | 500 | 30 | 21259.92 | 99.76 |
| InternetLTE | 5 | 592 | 35.52 | 21134.4 | 99.17 | 500 | 30 | 21254.4 | 99.73 |
| InternetLTE | 6 | 592 | 35.52 | 21098.88 | 99 | 500 | 30 | 21248.88 | 99.7 |
| InternetLTE | 7 | 592 | 35.52 | 21063.36 | 98.83 | 500 | 30 | 21243.36 | 99.68 |
| InternetLTE | 8 | 592 | 35.52 | 21027.84 | 98.67 | 500 | 30 | 21237.84 | 99.65 |
| InternetLTE | 9 | 592 | 35.52 | 20992.32 | 98.5 | 500 | 30 | 21232.32 | 99.63 |
| InternetLTE | 10 | 592 | 35.52 | 20956.8 | 98.33 | 500 | 30 | 21226.8 | 99.6 |
| TalkTime | 11 | 592 | 35.52 | 20921.28 | 98.17 | 450 | 27 | 21218.28 | 99.56 |
| TalkTime | 12 | 592 | 35.52 | 20885.76 | 98 | 450 | 27 | 21209.76 | 99.52 |
| TalkTime | 13 | 592 | 35.52 | 20850.24 | 97.83 | 450 | 27 | 21201.24 | 99.48 |
| TalkTime | 14 | 592 | 35.52 | 20814.72 | 97.67 | 450 | 27 | 21192.72 | 99.44 |
| TalkTime | 15 | 592 | 35.52 | 20779.2 | 97.5 | 450 | 27 | 21184.2 | 99.4 |
| TalkTime | 16 | 592 | 35.52 | 20743.68 | 97.33 | 450 | 27 | 21175.68 | 99.36 |
| TalkTime | 17 | 592 | 35.52 | 20708.16 | 97.17 | 450 | 27 | 21167.16 | 99.32 |
| TalkTime | 18 | 592 | 35.52 | 20672.64 | 97 | 450 | 27 | 21158.64 | 99.28 |
| TalkTime | 19 | 592 | 35.52 | 20637.12 | 96.83 | 450 | 27 | 21150.12 | 99.24 |
| TalkTime | 20 | 592 | 35.52 | 20601.6 | 96.67 | 450 | 27 | 21141.6 | 99.2 |
| InternetLTE | 21 | 592 | 35.52 | 20566.08 | 96.5 | 333 | 19.9998 | 21126.08 | 99.13 |
| InternetLTE | 22 | 592 | 35.52 | 20530.56 | 96.33 | 333 | 19.9998 | 21110.56 | 99.05 |
| InternetLTE | 23 | 592 | 35.52 | 20495.04 | 96.17 | 333 | 19.9998 | 21095.04 | 98.98 |
| InternetLTE | 24 | 592 | 35.52 | 20459.52 | 96 | 333 | 19.9998 | 21079.52 | 98.91 |
| InternetLTE | 25 | 592 | 35.52 | 20424 | 95.83 | 333 | 19.9998 | 21064 | 98.84 |
| InternetLTE | 26 | 592 | 35.52 | 20388.48 | 95.67 | 333 | 19.9998 | 21048.48 | 98.76 |
| InternetLTE | 27 | 592 | 35.52 | 20352.96 | 95.5 | 333 | 19.9998 | 21032.96 | 98.69 |
| InternetLTE | 28 | 592 | 35.52 | 20317.44 | 95.33 | 333 | 19.9998 | 21017.44 | 98.62 |
| InternetLTE | 29 | 592 | 35.52 | 20281.92 | 95.17 | 333 | 19.9998 | 21001.92 | 98.55 |
| InternetLTE | 30 | 592 | 35.52 | 20246.4 | 95 | 333 | 19.9998 | 20986.4 | 98.47 |
| TalkTime | 31 | 592 | 35.52 | 20210.88 | 94.83 | 333 | 19.9998 | 20970.88 | 98.4 |
| TalkTime | 32 | 592 | 35.52 | 20175.36 | 94.67 | 333 | 19.9998 | 20955.36 | 98.33 |
| TalkTime | 33 | 592 | 35.52 | 20139.84 | 94.5 | 333 | 19.9998 | 20939.84 | 98.25 |
| TalkTime | 34 | 592 | 35.52 | 20104.32 | 94.33 | 333 | 19.9998 | 20924.32 | 98.18 |
| TalkTime | 35 | 592 | 35.52 | 20068.8 | 94.17 | 333 | 19.9998 | 20908.8 | 98.11 |
| Audio | 36 | 148 | 8.88 | 20059.92 | 94.12 | 148 | 8.88 | 20908.8 | 98.11 |
| Audio | 37 | 148 | 8.88 | 20051.04 | 94.08 | 148 | 8.88 | 20908.8 | 98.11 |
| Audio | 38 | 148 | 8.88 | 20042.16 | 94.04 | 148 | 8.88 | 20908.8 | 98.11 |
| Audio | 39 | 148 | 8.88 | 20033.28 | 94 | 148 | 8.88 | 20908.8 | 98.11 |
| Audio | 40 | 148 | 8.88 | 20024.4 | 93.96 | 148 | 8.88 | 20908.8 | 98.11 |
| Audio | 41 | 148 | 8.88 | 20015.52 | 93.92 | 148 | 8.88 | 20908.8 | 98.11 |
| Audio | 42 | 148 | 8.88 | 20006.64 | 93.87 | 148 | 8.88 | 20908.8 | 98.11 |
| Audio | 43 | 148 | 8.88 | 19997.76 | 93.83 | 148 | 8.88 | 20908.8 | 98.11 |
| Audio | 44 | 148 | 8.88 | 19988.88 | 93.79 | 148 | 8.88 | 20908.8 | 98.11 |
| Audio | 45 | 148 | 8.88 | 19980 | 93.75 | 148 | 8.88 | 20908.8 | 98.11 |
| Audio | 46 | 148 | 8.88 | 19971.12 | 93.71 | 148 | 8.88 | 20908.8 | 98.11 |
| Audio | 47 | 148 | 8.88 | 19962.24 | 93.67 | 148 | 8.88 | 20908.8 | 98.11 |
| Audio | 48 | 148 | 8.88 | 19953.36 | 93.62 | 148 | 8.88 | 20908.8 | 98.11 |
| Audio | 49 | 148 | 8.88 | 19944.48 | 93.58 | 148 | 8.88 | 20908.8 | 98.11 |
| Audio | 50 | 148 | 8.88 | 19935.6 | 93.54 | 148 | 8.88 | 20908.8 | 98.11 |
| Standby | 51 | 24 | 1.42 | 19934.18 | 93.53 | 200 | 12 | 20919.38 | 98.16 |
| Standby | 52 | 24 | 1.42 | 19932.76 | 93.53 | 200 | 12 | 20929.96 | 98.21 |
| Standby | 53 | 24 | 1.42 | 19931.34 | 93.52 | 200 | 12 | 20940.53 | 98.26 |
| Standby | 54 | 24 | 1.42 | 19929.92 | 93.51 | 200 | 12 | 20951.11 | 98.31 |
| Standby | 55 | 24 | 1.42 | 19928.5 | 93.51 | 200 | 12 | 20961.69 | 98.36 |
| Standby | 56 | 24 | 1.42 | 19927.08 | 93.5 | 200 | 12 | 20972.27 | 98.41 |
| Standby | 57 | 24 | 1.42 | 19925.65 | 93.49 | 200 | 12 | 20982.85 | 98.46 |
| Standby | 58 | 24 | 1.42 | 19924.23 | 93.49 | 200 | 12 | 20993.43 | 98.51 |
| Standby | 59 | 24 | 1.42 | 19922.81 | 93.48 | 200 | 12 | 21004.01 | 98.55 |
| Standby | 60 | 24 | 1.42 | 19921.39 | 93.47 | 200 | 12 | 21014.59 | 98.6 |

In the above tables 3-5 the first column indicates the device's state (activity type), which determines the energy utilization for the given time. The second column is the minute time period within the modeled hour. The third and fourth columns indicate the discharge rate in milliwatts and Joules respectively. Again, discharge rates are dependent upon the device type, and status of the device. The fifth column indicates the charge remaining within the device's battery (in Joules). The sixth column indicates the percentage battery level at the given time period (assuming no charge has been provided). Column seven and eight provide the amount of power that is wirelessly provided to the given devices in milliwatts and Joules respectively. The battery capacity assuming this charge is being provided is then illustrated in column nine. The charged battery capacity percentage is in the final column.

Figure 14A:
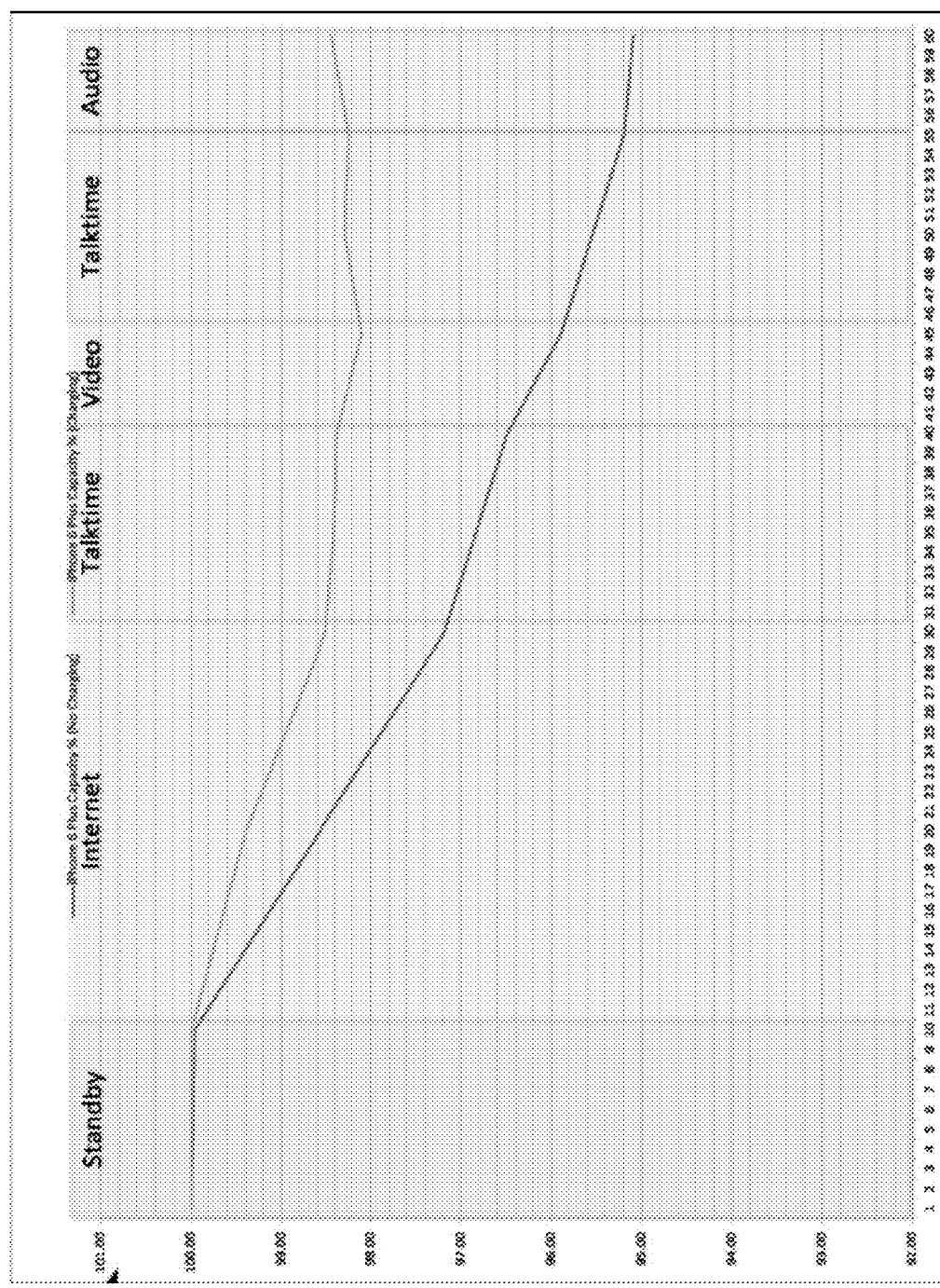
FIGS. 14A and 14B illustrate the percentage battery capacity for these representative devices either charged or uncharged in order to more clearly illustrate the impact that wireless charging has on mobile devices.
Figure 14B:
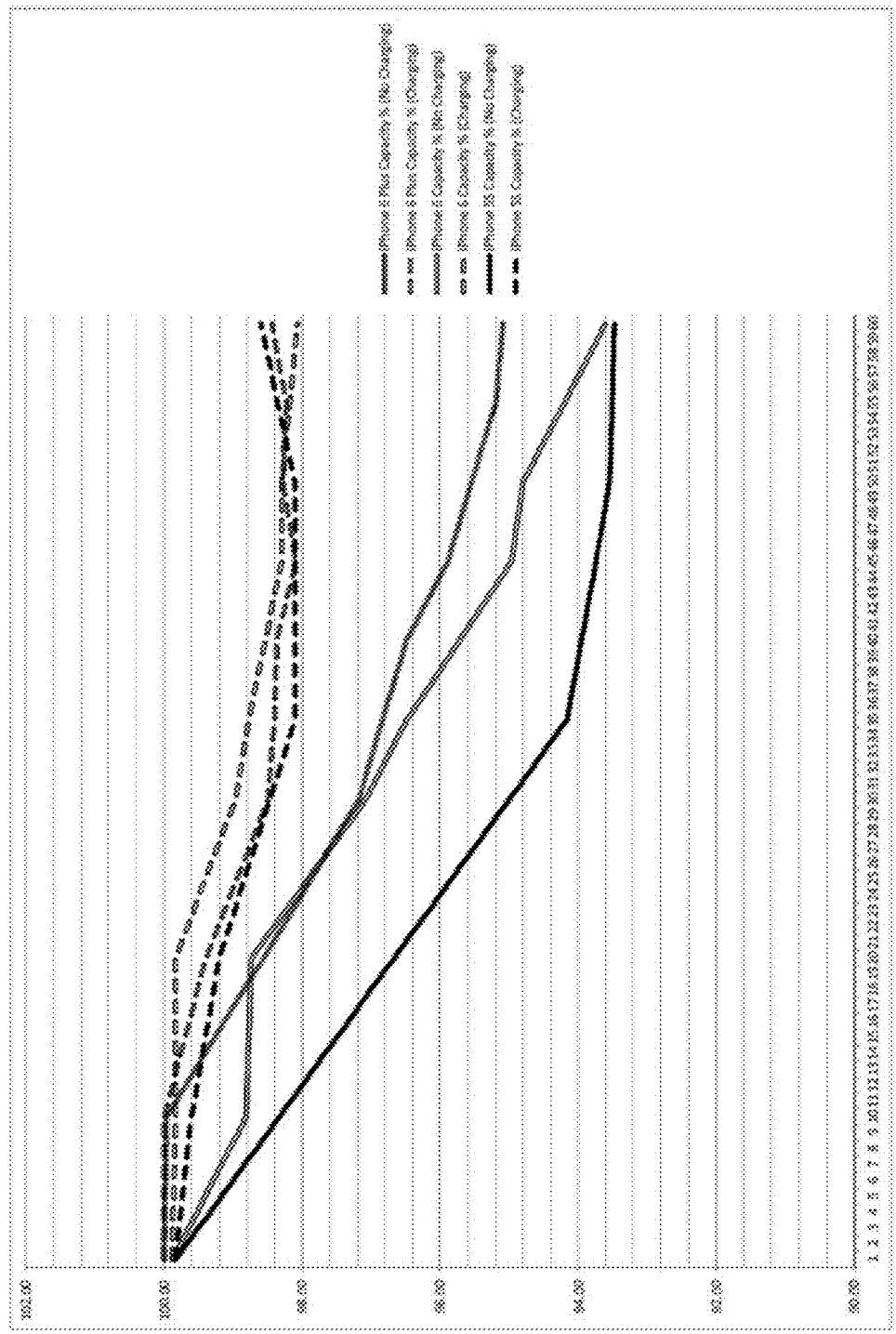

As can be seen, by delivering a wireless charge, much of a device's power utilization may be mitigated, even under relatively demanding utilization. FIGS. 14A and 14B illustrate the percentage battery capacity for these representative devices either charged or uncharged in order to more clearly illustrate the impact that wireless charging has on mobile devices. At FIG. 14A the percent capacity of the iPhone 6 plus is illustrated with the various states presented. In contrast, at FIG. 14B, the percentage battery capacity for each of the iPhone 6 plus, iPhone 6 and iPhone 5s under the above usages conditions are illustrated in order to exemplify the impact that wireless powering has upon relative battery levels.

D. Example Power Consumption Calculations

As discussed herein, the scheduling methods disclosed can require some input regarding the device's power consumption in order to calculate important downstream metrics such as time-to-death, pattern recognition, and the like.

Techniques for calculating power consumption in wireless power delivery systems are discussed in greater detail in the following section. More specifically, techniques for calculating power consumption of devices, operating systems and applications are disclosed. For example, if an iPhone and Android phone (Samsung Galaxy 5, for example) are being charged via a wireless power delivery system, then the system can record power consumption of: the iPhone, the Samsung Galaxy, the specific version of iOS running on the iPhone, the specific version of Android on the Galaxy, and the power consumption of each of the applications running these devices. Furthermore, a map app would consume more power if it is using GPS and a constant data connection to a website (vs. an app that does not). Also, sometimes users notice that their phone runs out of charge more quickly than before but they are not sure why. This application can make it easier to pinpoint the "offending" item resulting in the premature power loss.

In some embodiments, the wireless device has installed a simple client application on its operating system (iOS, Android, etc.). The wireless device initially reports the device hardware information and the operating system device information to the charger. The client will periodically update relevant information such as running apps, battery level, and location to the charger. The charger reports this information collected from the client to an admin interface and a specified cloud location. The cloud sends information and alerts if power level consumption exceeds a threshold or usual/average value. The cloud also can send recommendations regarding power usage based on previously collected information to the device through the charger. The cloud user will have the capability to be able to monitor the calculated power usage based on hardware, OS, running apps. This information can be beneficial to telecommunication companies, energy companies, and application developers to optimize development across platform and device manufacturers.

In some embodiments, the techniques described herein solve the problem of enabling a charger system to calculate the power consumption requirements for hardware, operating systems and applications consistently across devices that are based on different platforms.

In some embodiments, operating systems such as iOS do provide a breakdown of application battery consumption by application. However, the techniques described herein are based on the operating system itself and not a centralized service that provides the information across different hardware, operating systems and applications.

Figure 15:
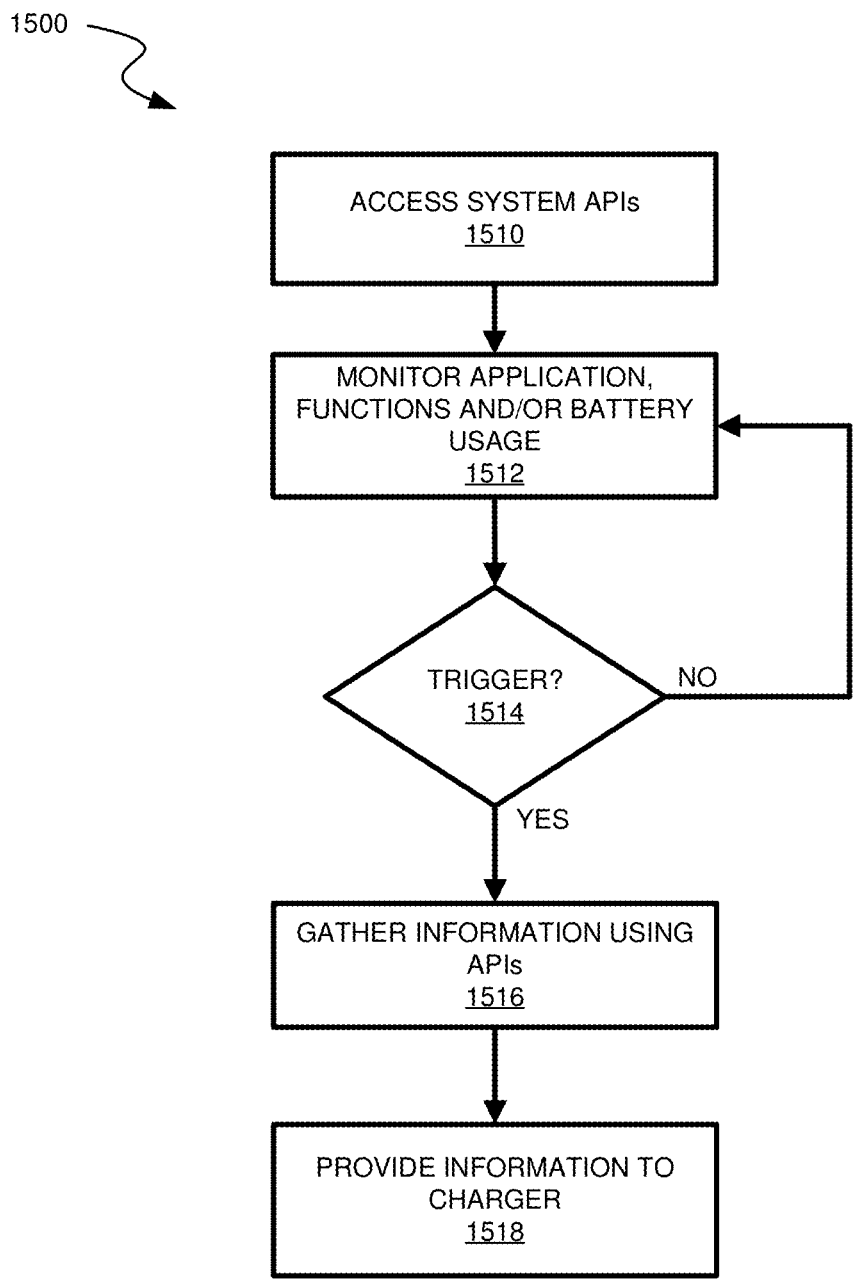
FIGS. 15 and 16 are flow diagrams illustrating example processes facilitating calculation of power consumption of wireless devices in accordance with some embodiments.
Figure 16:
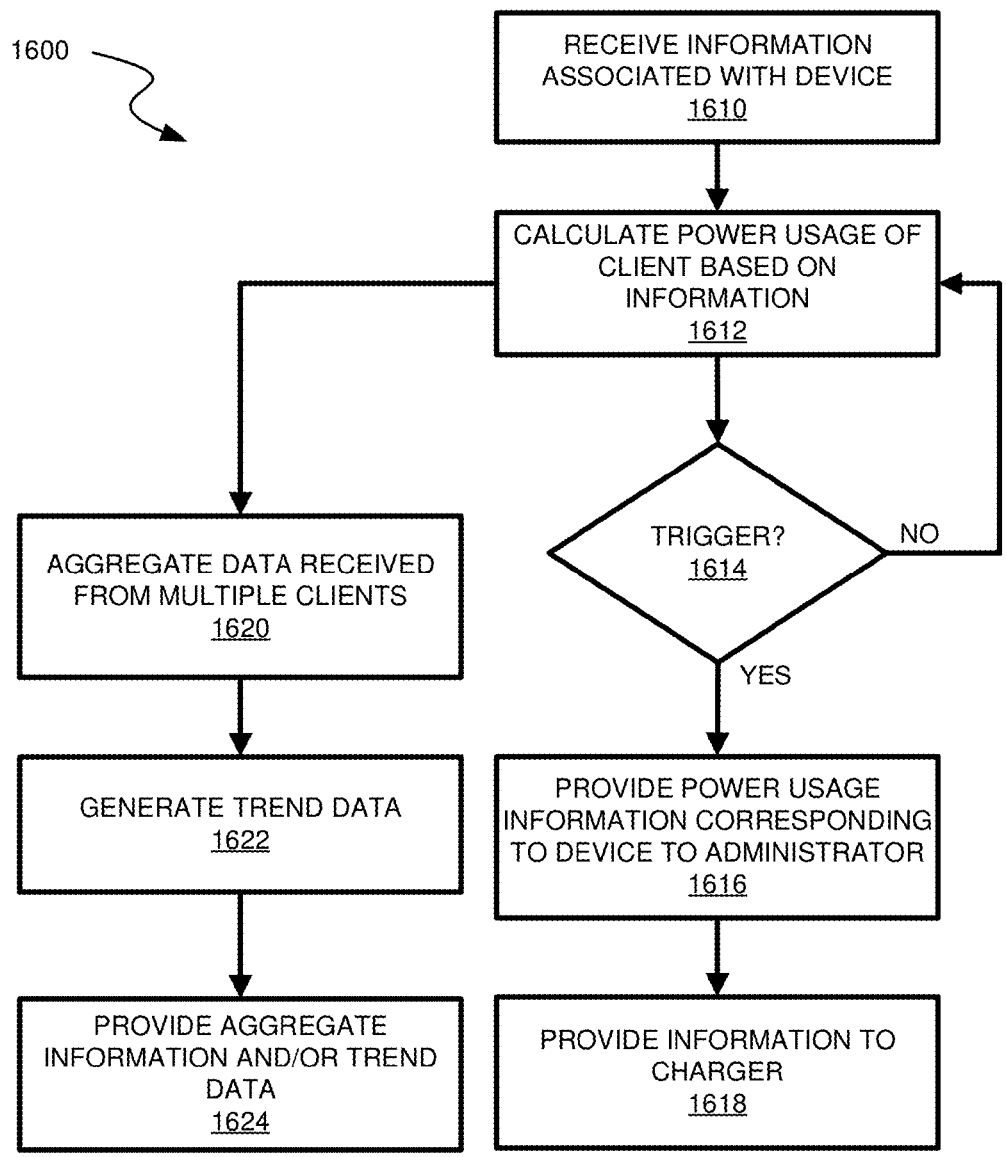

FIGS. 15 and 16 are flow diagrams illustrating example processes 1500 and 1600, respectively, facilitating calculation of power consumption of wireless devices, according to various embodiments. An application and/or software module having instructions included therein can be executed by one or more processors of the wireless device to cause the wireless device, in conjunction with a power receiver client such as, for example, client 103 of FIG. 1, to perform the example process 1500. An application and/or software module having instructions included therein can be executed by one or more processors of a wireless power transmission system (charger) or a cloud processing system to perform the example process 1600.

Referring to FIG. 15, process 1500 illustrates a flow diagram showing an example process facilitating calculation of power consumption of a wireless device in a wireless power delivery environment, according to an embodiment. To begin, at process 1510, the wireless device accesses one or more Application Program Interfaces (APIs) on the wireless device to gather information related to the wireless device. For example, the information can include a device manufacturer name or ID, device model, hardware, operating system, etc. The information can also include periodic updates on applications currently running or executing on the wireless device, current battery level of the primary battery of the wireless device, the wireless device's current/past locations, etc.

At process 1512, the wireless device monitors the applications executing on the wireless device (e.g., those applications that are running or have a footprint in RAM). At a decision process 1514, the wireless device determines if a trigger is detected. In some embodiments, the trigger can be configured to occur periodically. Alternatively, or additionally, the trigger can occur if, for example, a threshold level of power is crossed (either the power dips below low power threshold or power increases to or above upper power threshold). At process 1516, responsive to the trigger, the wireless device gathers power information about the wireless device and, at process 1518, provides the power information to a charger.

Referring now to FIG. 16, process 1600 illustrates a flow diagram showing an alternate example process facilitating calculation of power consumption of a wireless device in a wireless power delivery environment, according to an embodiment. To begin, a wireless charger receives power information from a wireless device and transfers the information to a cloud processing system. As discussed above, some or all of the processes or steps discussed can alternatively or additionally be performed by a charger in other embodiments.

At process 1610, the cloud processing system receives the information associated with the wireless device. At process 1612, the cloud processing system calculates power usage of the client based on the information. Next, at a decision process 1614, the cloud processing system determines if a trigger has been detected as previously discussed in the prior example process. If a trigger occurs, at process 1616, the cloud processing system responsively provides power usage information corresponding to the wireless device to an administrator and, at process 1618, to the wireless charger.

In some embodiments, the process can also branch at process 1612 to process 1620 where the cloud processing system aggregates data received from multiple devices and, at process 1622, processes the data to identify various trends across geographies, chargers, environments, devices, etc.

Once identified, at process 1624, the cloud processing system provides the aggregated data and or the trend data to a data consumer.

III. Example Systems

Figure 17:
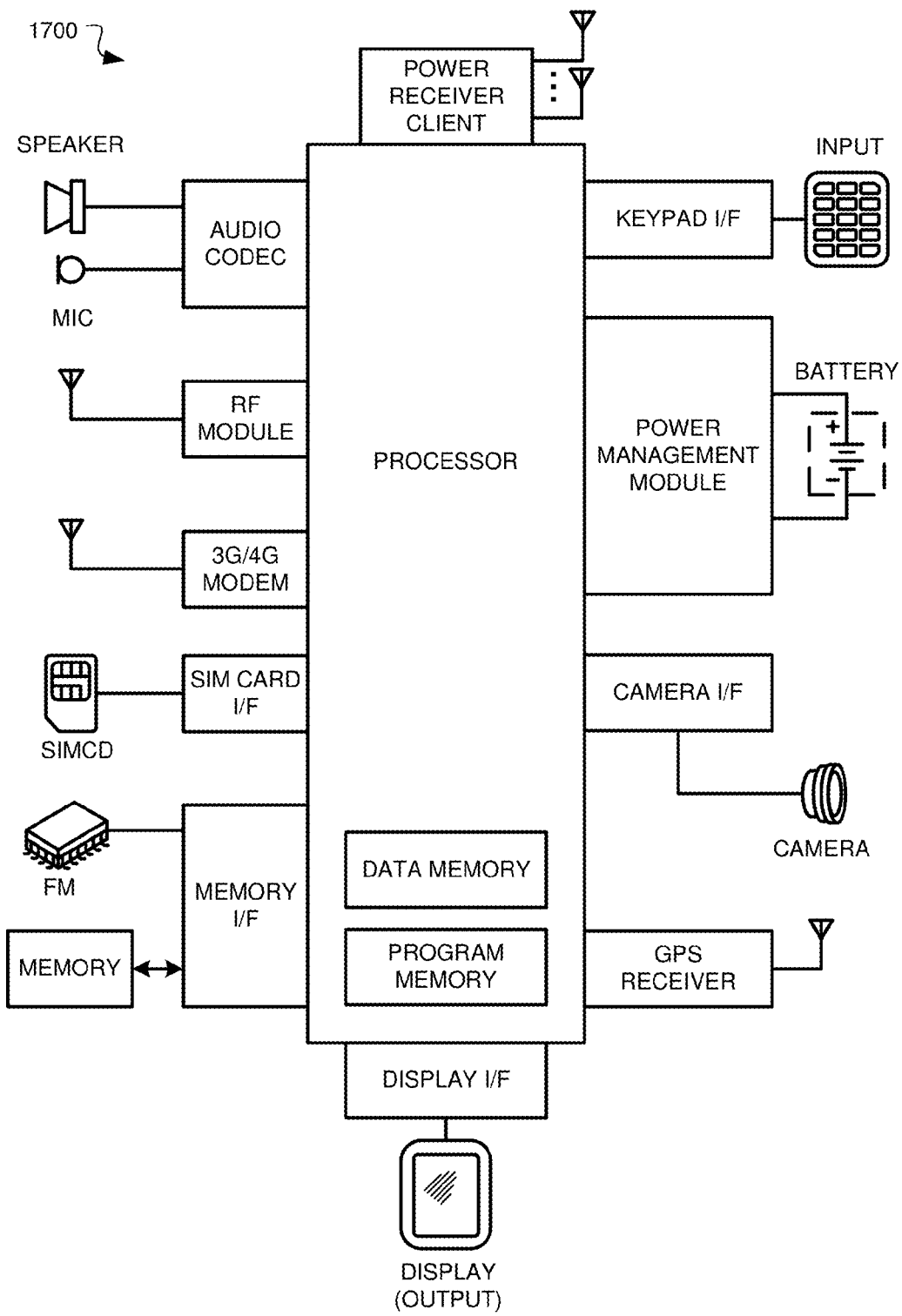
FIG. 17 depicts a block diagram illustrating example components of a representative mobile device or tablet computer with one or more wireless power receiver clients in the form of a mobile (or smart) phone or tablet computer device, according to some embodiments.

FIG. 17 depicts a block diagram illustrating example components of a representative mobile device or tablet computer 1700 with a wireless power receiver or client in the form of a mobile (or smart) phone or tablet computer device, according to an embodiment. Various interfaces and modules are shown with reference to FIG. 17, however, the mobile device or tablet computer does not require all of modules or functions for performing the functionality described herein. It is appreciated that, in many embodiments, various components are not included and/or necessary for operation of the category controller. For example, components such as GPS radios, cellular radios, and accelerometers may not be included in the controllers to reduce costs and/or complexity. Additionally, components such as ZigBee™ radios and RFID transceivers, along with antennas, can populate the Printed Circuit Board.

The wireless power receiver client can be a power receiver client 103 of FIG. 1, although alternative configurations are possible. Additionally, the wireless power receiver client can include one or more RF antennas for reception of power and/or data signals from a power transmission system, e.g., wireless power transmission system 101 of FIG. 1.

Figure 18:
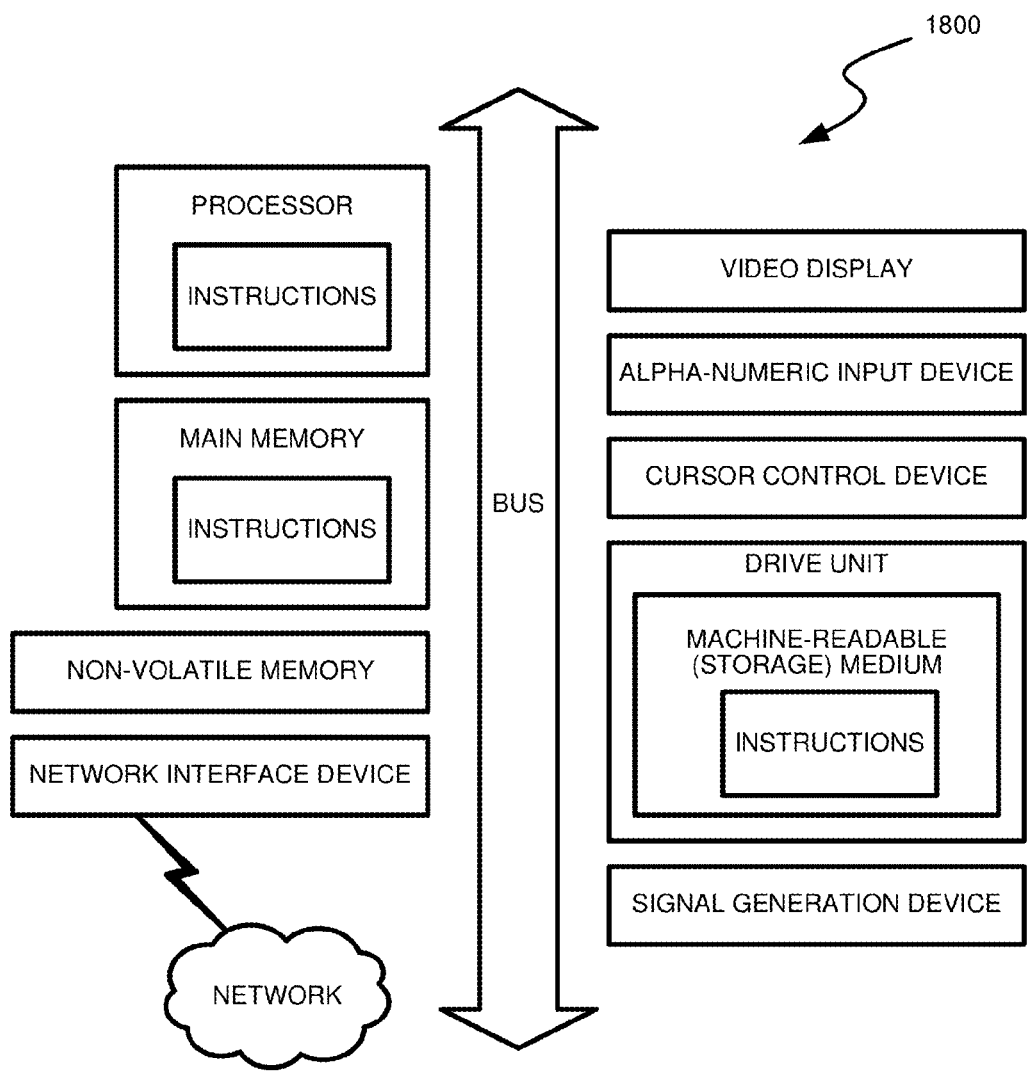
FIG. 18 depicts a diagrammatic representation of a machine, in the example form, of a computer system within which a set of instructions, for causing the machine to perform any one or more of the methodologies discussed herein, may be executed.

FIG. 18 depicts a diagrammatic representation of a machine, in the example form, of a computer system within which a set of instructions, for causing the machine to perform any one or more of the methodologies discussed herein, may be executed.

In the example of FIG. 18, the computer system includes a processor, memory, non-volatile memory, and an interface device. Various common components (e.g., cache memory) are omitted for illustrative simplicity. The computer system 1800 is intended to illustrate a hardware device on which any of the components depicted in the example of FIG. 1 (and any other components described in this specification) can be implemented. For example, the computer system can be any radiating object or antenna array system. The computer system can be of any applicable known or convenient type. The components of the computer system can be coupled together via a bus or through some other known or convenient device.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer 1800. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium". A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system. The interface can include an analog modem, isdn modem, cable modem, token ring interface, satellite transmission interface (e.g. "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 9 reside in the interface.

In operation, the computer system 1800 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may thus be implemented using a variety of programming languages.

In alternative embodiments, the machine operates as a standalone device or may be connected (e.g., networked) to other machines. In a networked deployment, the machine may operate in the capacity of a server or a client machine in a client-server network environment or as a peer machine in a peer-to-peer (or distributed) network environment.

The machine may be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation.

In general, the routines executed to implement the embodiments of the disclosure, may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are, at times, shown as being performed in a series, these processes or blocks may instead be performed in parallel, or may be performed at different times. Further, any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. § 112, ¶6, other aspects may likewise be embodied as a means-plus-function claim, or in other forms, such as being embodied in a computer-readable medium. (Any claims intended to be treated under 35 U.S.C. § 112, ¶6 will begin with the words "means for".) Accordingly, the applicant reserves the right to add additional claims after filing the application to pursue such additional claim forms for other aspects of the disclosure.

The detailed description provided herein may be applied to other systems, not necessarily only the system described above. The elements and acts of the various examples described above can be combined to provide further implementations of the invention. Some alternative implementations of the invention may include not only additional elements to those implementations noted above, but also may include fewer elements. These and other changes can be made to the invention in light of the above Detailed Description. While the above description defines certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention.

What is claimed is:

1. A method of generating an adaptive wireless power delivery schedule for a wireless power transmission system, the method comprising:
    identifying information associated with devices located in a wireless power coverage area of the wireless power transmission system,
        wherein the information associated with the devices comprises battery and usage parameters including, for each device, a type of device, power consumption of the device and a current power level of the device;
    modeling power requirements of the devices located in the wireless power coverage area of the wireless power transmission system by:
        calculating a time-to-death for each of the devices based on the battery and usage parameters;
        categorizing the devices based on corresponding mobility behavior;
        determining a minimum power threshold for each of the devices;
        comparing the time-to-death to the minimum power threshold for each of the devices; and
        generating the power requirements models based on the comparisons; and
    generating the adaptive wireless power delivery schedule based on the power requirement models.

2. The method of claim 1, further comprising:
    providing directed wireless radio frequency power to wireless power receivers in the wireless power coverage area in accordance with the wireless power delivery schedule,
    wherein each of the devices is associated with one or more of the wireless power receivers.

3. The method of claim 1, wherein categorizing the devices based on corresponding mobility behavior includes classifying each device as one or more of a 'resident' device, a 'transitory' device, or a 'predictable' device.

4. The method of claim 1, wherein the minimum power threshold is determined based on a device type.

5. The method of claim 1, wherein identifying the information associated with the devices located in the wireless power coverage area includes identifying a number of devices located within the coverage region and a type of each of the devices.

6. The method of claim 1, wherein identifying the information associated with the devices located in the wireless power coverage area further comprises:
    receiving a radio identifier from each wireless power receiver, wherein each wireless power receiver is associated with one of the devices; and
    accessing receiver information for a corresponding device using the radio identifier.

7. The method of claim 6, further wherein identifying the information associated with the devices located in the wireless power coverage area further comprises:
    determining if any of the receiver information is missing; and
    determining if the missing information is discoverable when the receiver information missing.

8. The method of claim 7, further comprising:
    querying a receiver for the missing information when the missing information is discoverable.

9. The method of claim 7, further comprising,
    inferring the missing information when the missing information is not discoverable.

10. A wireless power transmission system, comprising:
an adaptively-phased antenna array having multiple radio frequency (RF) transceivers;
control circuitry configured to:
identify information associated with devices located in a wireless power coverage area of the wireless power transmission system
wherein the information associated with the devices comprises battery and usage parameters;
calculate a time-to-death for each of the devices based on the battery and usage parameters;
categorize the devices based on corresponding mobility behavior;
determine a minimum power threshold for each of the devices;
compare the time-to-death to the minimum power threshold for each of the devices;
generate power requirements models for the devices located in the wireless power coverage area of the wireless power transmission system based on the comparisons; and
generate the adaptive wireless power delivery schedule based on the power requirement models.

11. The wireless power transmission system of claim 10, wherein the control circuitry is further configured to direct the adaptively-phased antenna array to:
provide directed wireless RF power to wireless power receivers in the wireless power coverage area in accordance with the wireless power delivery schedule,
wherein each of the devices is associated with one or more of the wireless power receivers.

12. The wireless power transmission system of claim 10, wherein the battery and usage parameters include, for each device, a type of device, power consumption of the device or a current power level of the device.

13. The wireless power transmission system of claim 10, wherein to categorize the devices based on corresponding mobility behavior, the control circuitry is configured to classify each device as one or more of a 'resident' device, a 'transitory' device, or a 'predictable' device.

14. The wireless power transmission system of claim 10, wherein the minimum power threshold is determined based on a device type.

15. The wireless power transmission system of claim 10, wherein to identify the information associated with the devices located in the wireless power coverage, the control circuitry is further configured to:
receive a radio identifier from each wireless power receiver, wherein each wireless power receiver is associated with one of the devices; and
access receiver information for a corresponding device using the radio identifier.

16. The wireless power transmission system of claim 10, wherein to identify the information associated with the devices located in the wireless power coverage, the control circuitry is further configured to:
determine if any of the receiver information missing;
determine if the missing information is discoverable when receiver information missing;
query a receiver for the missing information when the missing information is discoverable; and
infer the missing information when the missing information is not discoverable.

17. A non-transitory computer readable storage medium having program instructions stored thereon, which when executed by one or more processors of a wireless power transmission system, cause the wireless power transmission system to:
identify information associated with devices located in a wireless power coverage area of the wireless power transmission system,
wherein the information associated with the devices comprises battery and usage parameters;
calculate a time-to-death for each of the devices based on the battery and usage parameters;
determine a minimum power threshold for each of the devices;
compare the time-to-death to the minimum power threshold for each of the devices;
generate power requirements models for the devices located in the wireless power coverage area of the wireless power transmission system based on the comparisons; and
generate the adaptive wireless power delivery schedule based on the power requirement models.

\* \* \* \* \*